(12) United States Patent
Lu et al.

(10) Patent No.: US 11,569,230 B2
(45) Date of Patent: *Jan. 31, 2023

(54) METHOD AND STRUCTURE FOR FINFET DEVICES

(71) Applicant: Taiwan Semiconductor Manufacturing Company, Ltd., Hsin-Chu (TW)

(72) Inventors: Yong-Yan Lu, Hsin-Chu (TW); Chia-Wei Soong, Hsin-Chu (TW); Hou-Yu Chen, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 302 days.

This patent is subject to a terminal disclaimer.

(21) Appl. No.: 17/063,087

(22) Filed: Oct. 5, 2020

(65) Prior Publication Data
US 2021/0020634 A1 Jan. 21, 2021

Related U.S. Application Data

(60) Continuation of application No. 16/222,081, filed on Dec. 17, 2018, now Pat. No. 10,797,052, which is a
(Continued)

(51) Int. Cl.
*H01L 27/092* (2006.01)
*H01L 29/66* (2006.01)
(Continued)

(52) U.S. Cl.
CPC ...... *H01L 27/0921* (2013.01); *H01L 21/2255* (2013.01); *H01L 21/823807* (2013.01);
(Continued)

(58) Field of Classification Search
None
See application file for complete search history.

(56) References Cited

U.S. PATENT DOCUMENTS 5,168,072 A 12/1992 Modlehi
7,199,430 B2 4/2007 Babcock et al.
(Continued)

OTHER PUBLICATIONS

Current et al., "Microwave and RTA Annealing of Phos-Doped, Strained Si(100) and (110) Implanted with Molecular Caron Ions", Ion Implantation and Annealing: New Process and Products section of SEMICON West 2013, San Francisco, CA, Junction Technology Group, Jul. 11, 2013, 17 pages.
(Continued)

*Primary Examiner* — Evren Seven
(74) *Attorney, Agent, or Firm* — Haynes and Boone, LLP

(57) ABSTRACT

A method for forming a semiconductor device comprises receiving a structure having a substrate, an isolation structure over the substrate, and a fin over the substrate and adjacent to the isolation structure. The method further includes etching a portion of the fin, resulting in a trench, forming a doped material layer over bottom and sidewalls of the trench, and growing at least one epitaxial layer over the doped material layer in the trench. The method further includes recessing the isolation structure and the doped material layer, leaving a first portion of the at least one epitaxial layer surrounded by the doped material layer and performing an annealing process, thereby driving dopants from the doped material layer into the first portion.

20 Claims, 21 Drawing Sheets

Related U.S. Application Data continuation of application No. 15/406,362, filed on Jan. 13, 2017, now Pat. No. 10,157,924, which is a division of application No. 14/619,353, filed on Feb. 11, 2015, now Pat. No. 9,553,172.

(51) Int. Cl.
- *H01L 21/8238* (2006.01)
- *H01L 29/78* (2006.01)
- *H01L 29/10* (2006.01)
- *H01L 21/225* (2006.01)
- *H01L 29/06* (2006.01)

(52) U.S. Cl.
CPC ........ *H01L 21/823821* (2013.01); *H01L 21/823878* (2013.01); *H01L 21/823892* (2013.01); *H01L 27/0924* (2013.01); *H01L 29/0653* (2013.01); *H01L 29/1054* (2013.01); *H01L 29/1083* (2013.01); *H01L 29/66795* (2013.01); *H01L 29/66803* (2013.01); *H01L 29/785* (2013.01); *H01L 29/7849* (2013.01)

(56) References Cited

U.S. PATENT DOCUMENTS

| | | | |
|---|---|---|---|
| 7,332,386 | B2 | 2/2008 | Lee |
| 7,955,928 | B2 | 6/2011 | Chan et al. |
| 8,487,378 | B2 | 7/2013 | Goto et al. |
| 8,729,634 | B2 | 5/2014 | Shen |
| 8,826,213 | B1 | 9/2014 | Ho et al. |
| 8,887,106 | B2 | 11/2014 | Ho et al. |
| 8,963,258 | B2 | 2/2015 | Yu |
| 9,082,853 | B2 | 7/2015 | Cheng |
| 9,184,293 | B2 | 11/2015 | Kim |
| 9,252,271 | B2 | 2/2016 | Lu et al. |
| 9,318,342 | B2 | 4/2016 | Xie et al. |
| 9,337,316 | B2 | 5/2016 | Tsai et al. |
| 9,343,371 | B1 | 5/2016 | Wu |
| 9,349,658 | B1 | 5/2016 | Jacob et al. |
| 9,397,002 | B1 | 7/2016 | Belyansky |
| 9,502,506 | B2 | 11/2016 | Leobandung et al. |
| 9,548,303 | B2 | 1/2017 | Lee |
| 9,576,814 | B2 | 2/2017 | Wu |
| 9,583,621 | B2 | 2/2017 | Zhu |
| 9,608,069 | B1 | 3/2017 | Basker |
| 10,056,380 | B2 | 8/2018 | Ghani |
| 10,204,821 | B2 | 2/2019 | Shin |
| 2007/0042612 | A1 | 2/2007 | Nishino et al. |
| 2008/0150033 | A1 | 6/2008 | Greene et al. |
| 2009/0057809 | A1 | 3/2009 | Richter et al. |
| 2009/0111239 | A1* | 4/2009 | Kim ............ H01L 29/7853 257/E21.703 |
| 2011/0049613 | A1 | 3/2011 | Yeh |
| 2011/0278676 | A1 | 11/2011 | Cheng et al. |
| 2012/0070948 | A1 | 3/2012 | Cheng et al. |
| 2012/0083107 | A1 | 4/2012 | Chang et al. |
| 2012/0248511 | A1 | 10/2012 | Guo et al. |
| 2013/0001591 | A1 | 1/2013 | Wu |
| 2013/0157431 | A1 | 6/2013 | Tsai et al. |
| 2013/0187235 | A1 | 7/2013 | Huang et al. |
| 2013/0200455 | A1 | 8/2013 | Lo et al. |
| 2013/0249021 | A1 | 9/2013 | Asenov et al. |
| 2013/0266741 | A1 | 10/2013 | Song et al. |
| 2013/0273729 | A1 | 10/2013 | Hempel et al. |
| 2013/0280883 | A1 | 10/2013 | Faul et al. |
| 2014/0008736 | A1 | 1/2014 | Li et al. |
| 2014/0054648 | A1 | 2/2014 | Itokawa |
| 2014/0227857 | A1 | 8/2014 | Youn et al. |
| 2014/0282326 | A1 | 9/2014 | Hsin et al. |
| 2015/0145066 | A1 | 5/2015 | Lu et al. |
| 2015/0179767 | A1 | 6/2015 | Wang et al. |
| 2015/0243755 | A1 | 8/2015 | Cheng |
| 2015/0255555 | A1 | 9/2015 | Xie et al. |
| 2015/0303284 | A1 | 10/2015 | Basker |
| 2015/0318381 | A1 | 11/2015 | Tsai et al. |
| 2015/0364578 | A1 | 12/2015 | Liu et al. |
| 2016/0005868 | A1 | 1/2016 | Wei et al. |
| 2016/0027699 | A1 | 1/2016 | Chien |
| 2016/0027779 | A1 | 1/2016 | Loo et al. |
| 2016/0027895 | A1 | 1/2016 | Akarvardar et al. |
| 2016/0093726 | A1 | 3/2016 | Ching et al. |
| 2016/0111542 | A1 | 4/2016 | Zhang et al. |
| 2016/0155670 | A1 | 6/2016 | Liaw |
| 2016/0181252 | A1 | 6/2016 | Arnold |
| 2016/0181360 | A1 | 6/2016 | Wang |
| 2016/0197079 | A1 | 7/2016 | Lin et al. |
| 2017/0133371 | A1 | 5/2017 | Lu et al. |
| 2019/0198645 | A1 | 6/2019 | Cheng |
| 2020/0144131 | A1 | 5/2020 | Miller |

OTHER PUBLICATIONS

Lojek, Bo, "Low Temperature Microwave Annealing of S/D", 16th IEEE International Conference on Advanced Thermal Processing of Semiconductors—RTP2008, Sep. 30-Oct. 3, 2008, 9 pages.

* cited by examiner

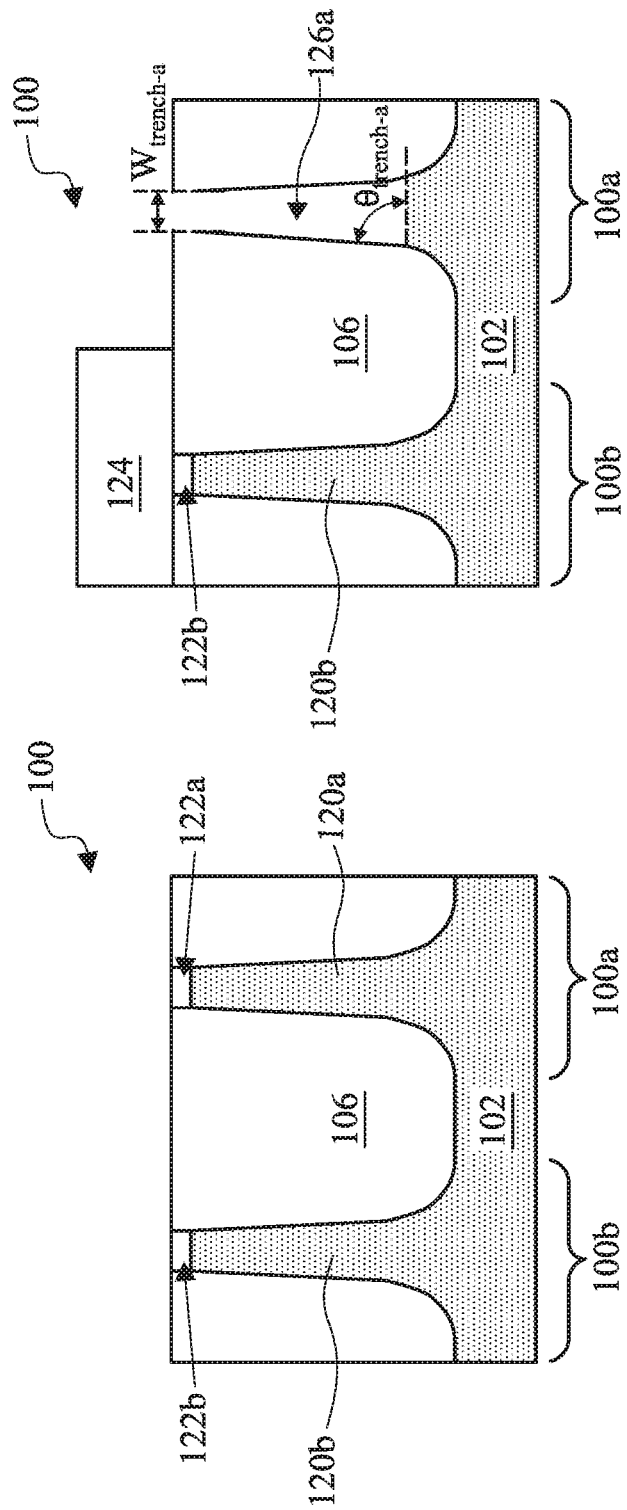

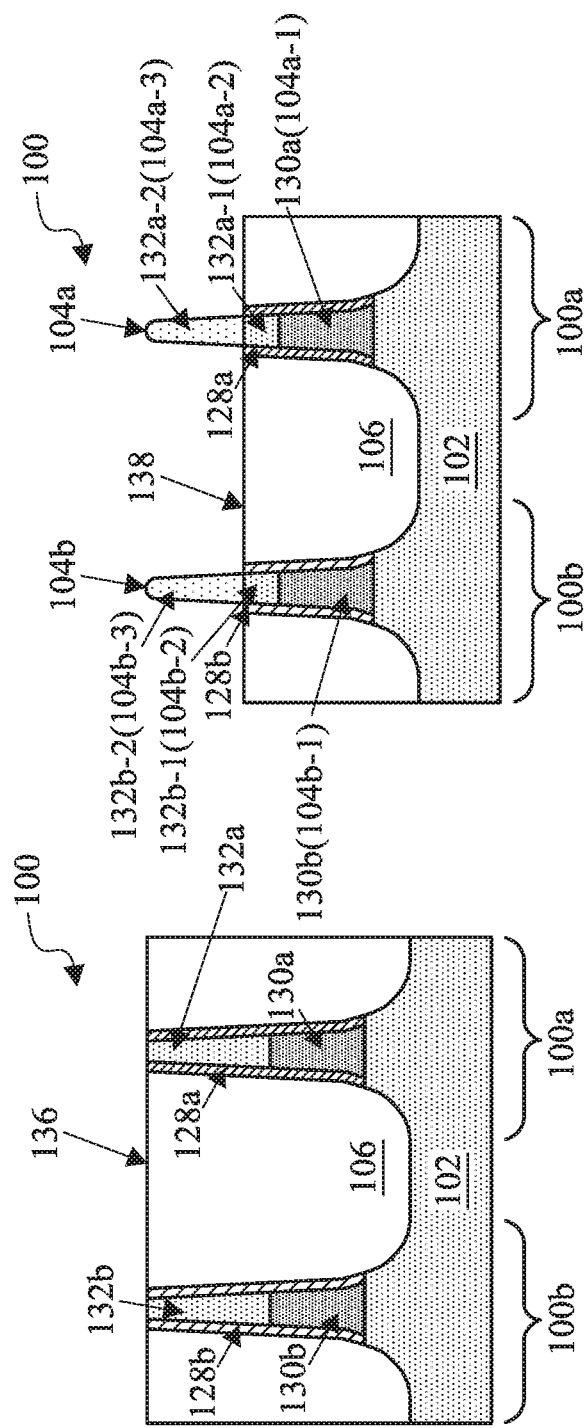

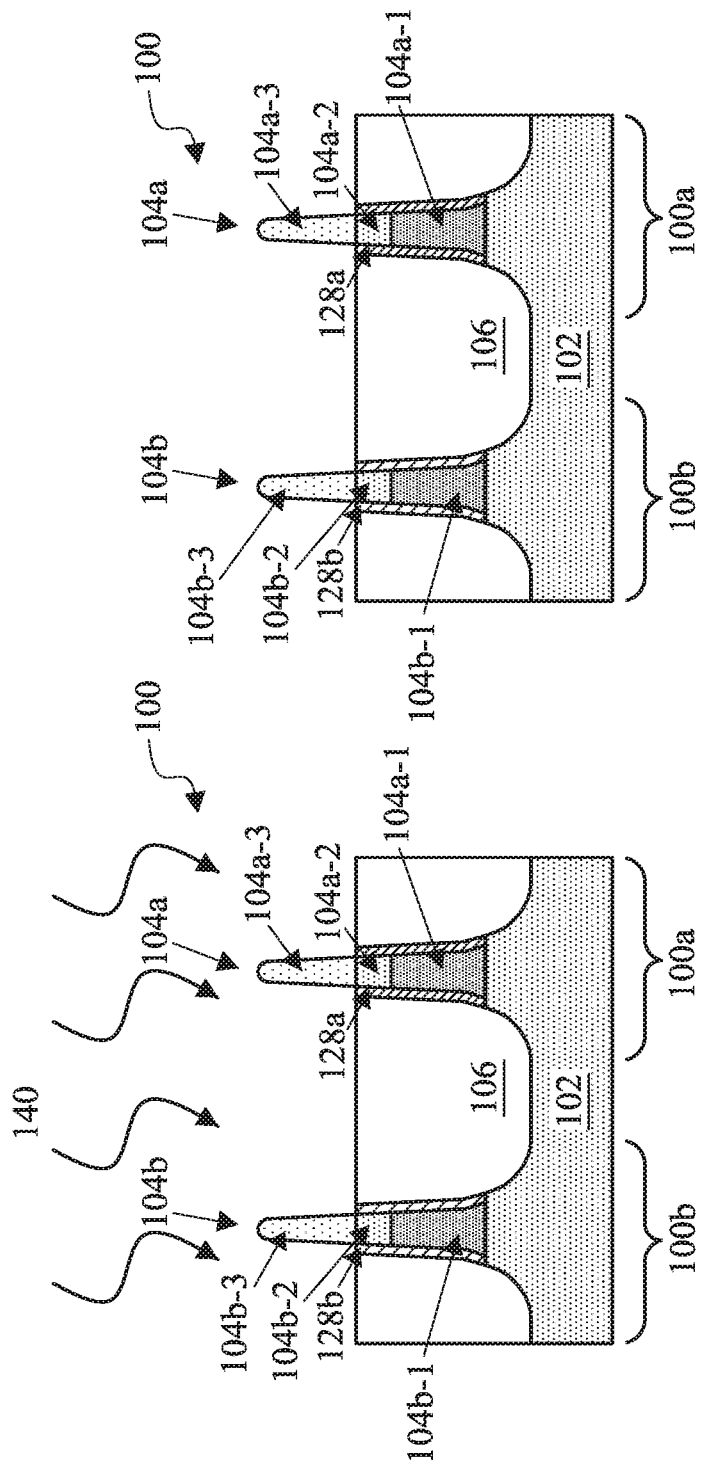

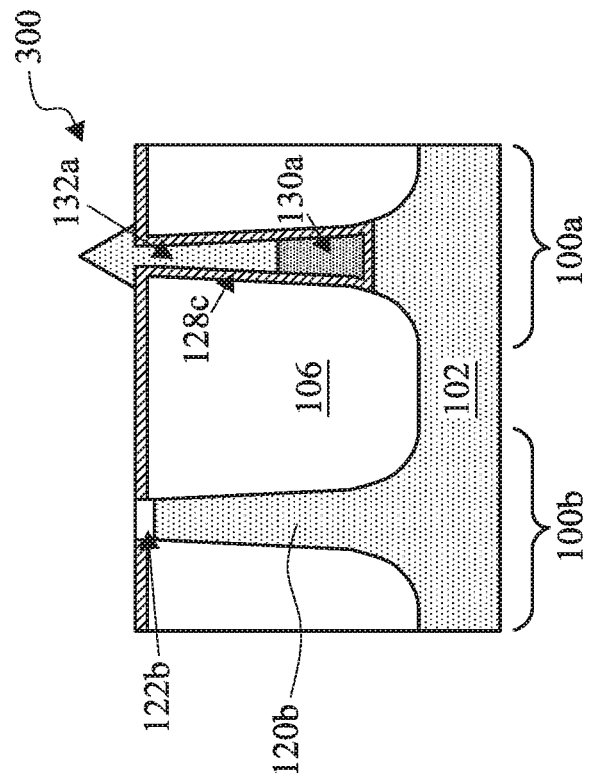
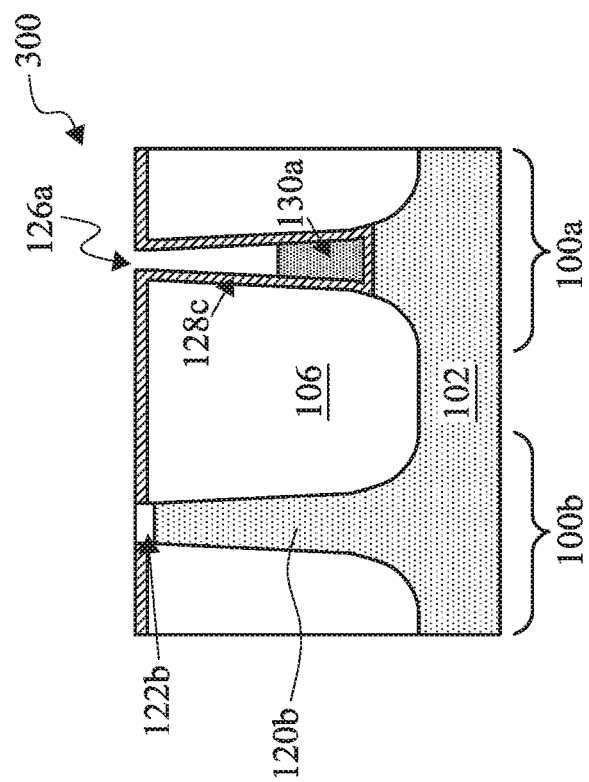
Fig. 4F
Fig. 4E

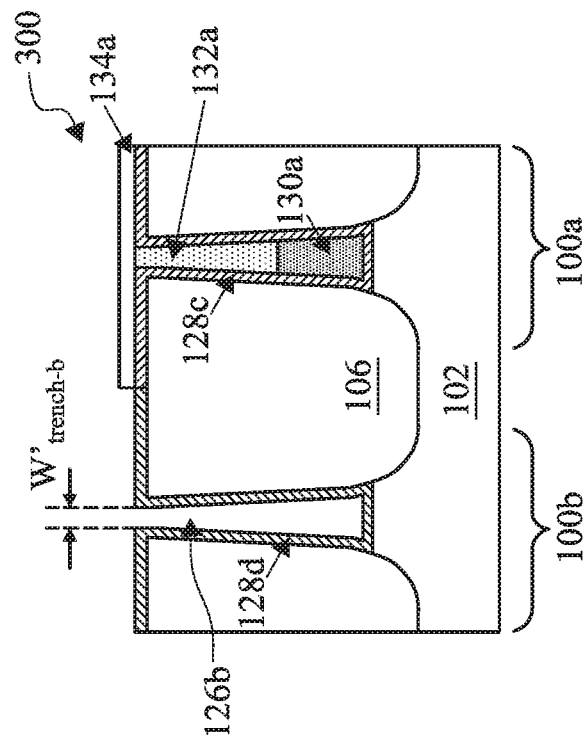
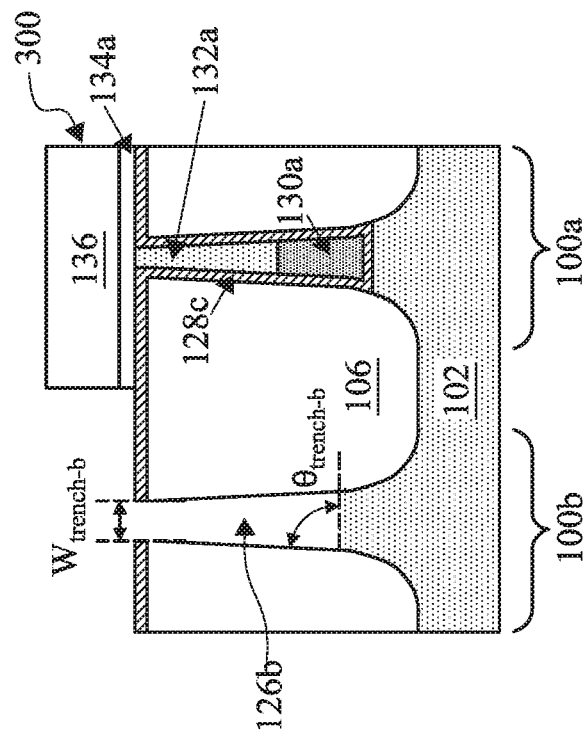
Fig. 4I
Fig. 4J

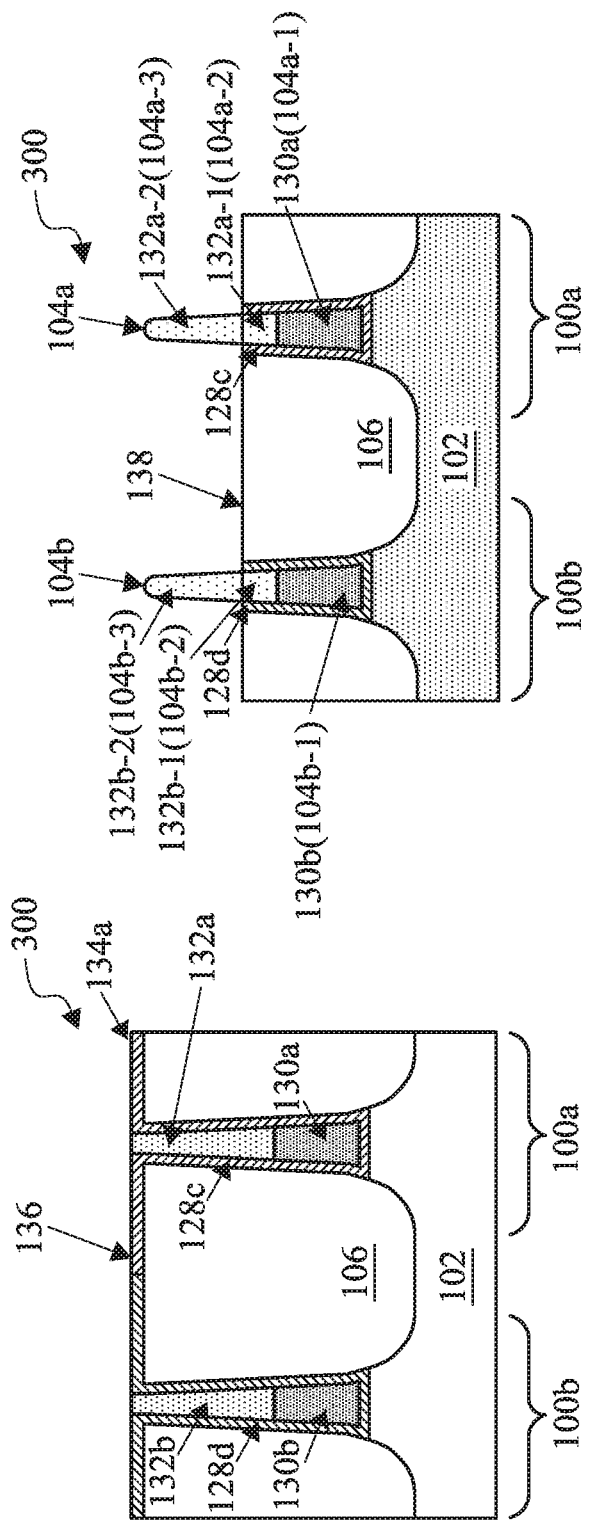

METHOD AND STRUCTURE FOR FINFET DEVICES

PRIORITY

This is a continuation of U.S. patent application Ser. No. 16/222,081, filed on Dec. 17, 2018, which is a continuation of U.S. patent application Ser. No. 15/406,362, filed Jan. 13, 2017 and issued U.S. Pat. No. 10,157,924, which is a divisional application of U.S. patent application Ser. No. 14/619,353, filed Feb. 11, 2015 and issued U.S. Pat. No. 9,553,172, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, multi-gate field effect transistors (FETs) such as fin field effect transistors (FinFETs) have been developed for their high drive currents with small footprints compared to traditional planar FETs. In one method, FinFETs are formed on bulk substrate for reduced manufacturing cost. However, typical bulk FinFETs suffer a punch-through issue where leakage currents may flow in a region not controlled by a gate. To overcome the punch-through issue, conventional methods implant heavy impurities into regions between the fin channel and the bulk substrate. These methods unavoidably implant impurities into the whole fin, adversely reducing the carrier mobility thereof. In addition, impurity implantation may also adversely affect channel strain of the fin.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B, 3C, 3D, 3E, 3F, 3G, 3H, 3I, 3J, 3K, 3L, 3M, 3N, 3O, 3P, 3Q, and 3R are cross sectional views of forming a semiconductor device according to the method of FIG. 2, in accordance with some embodiments.

FIGS. 4A, 4B, 4C, 4D, 4E, 4F, 4G, 4H, 4I, 4J, 4K, 4L, 4M, 4N, 4O, and 4P are cross sectional views of forming another semiconductor device according to the method of FIG. 2, in accordance with some embodiments.

DETAILED DESCRIPTION

Figure 1A:
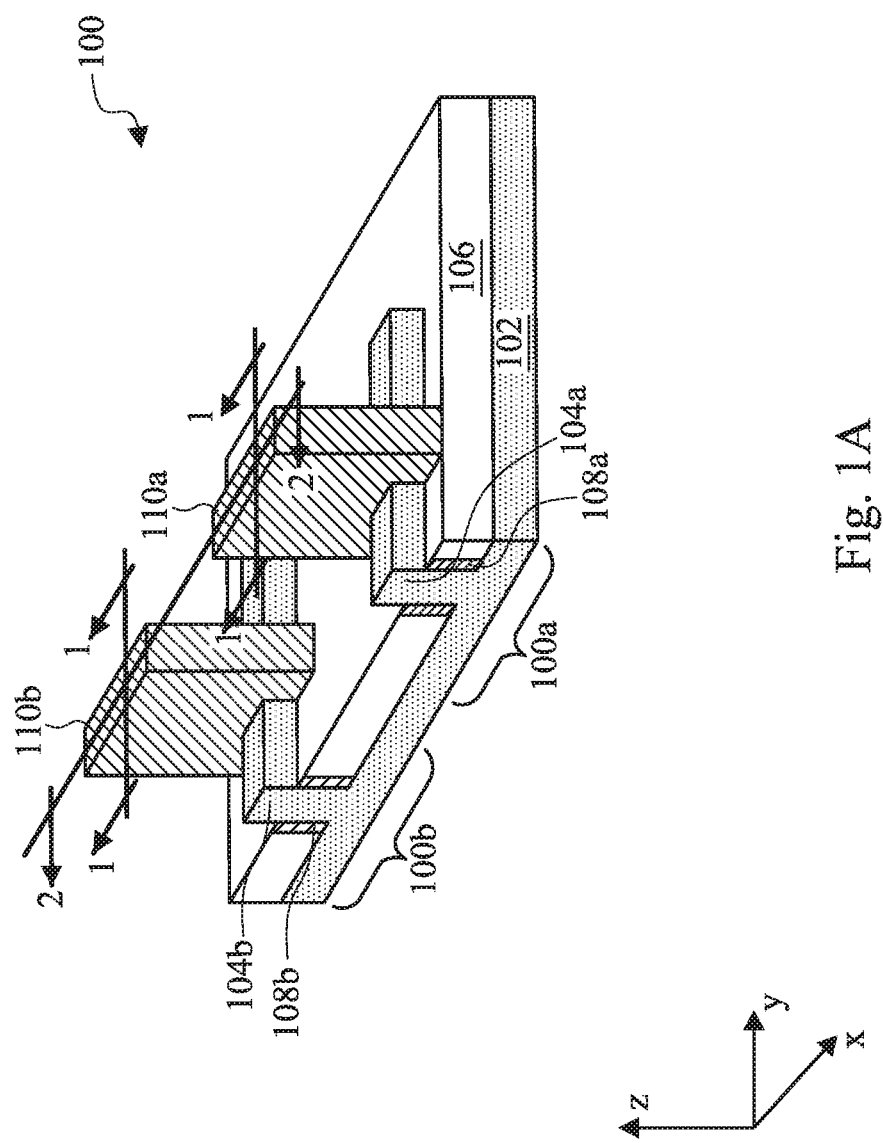
FIGS. 1A, 1B, and 1C are perspective and cross-sectional views of a semiconductor device, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to semiconductor devices having multi-gate FETs, such as double gate FETs, tri-gate FETs, and FinFETs. It is an objective of the present disclosure to provide methods for and structures of semiconductor devices that effectively overcome punch-through issues in multi-gate FETs while providing excellent carrier mobility and high short channel effect control.

Figure 1B:
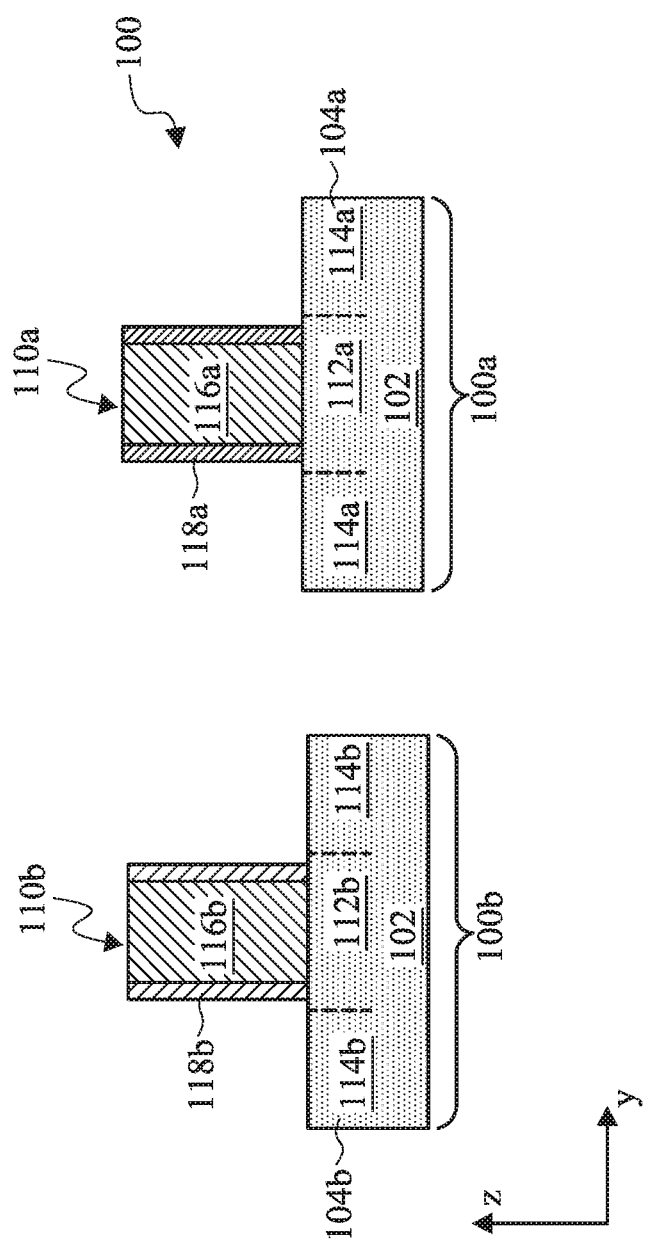
Figure 1C:
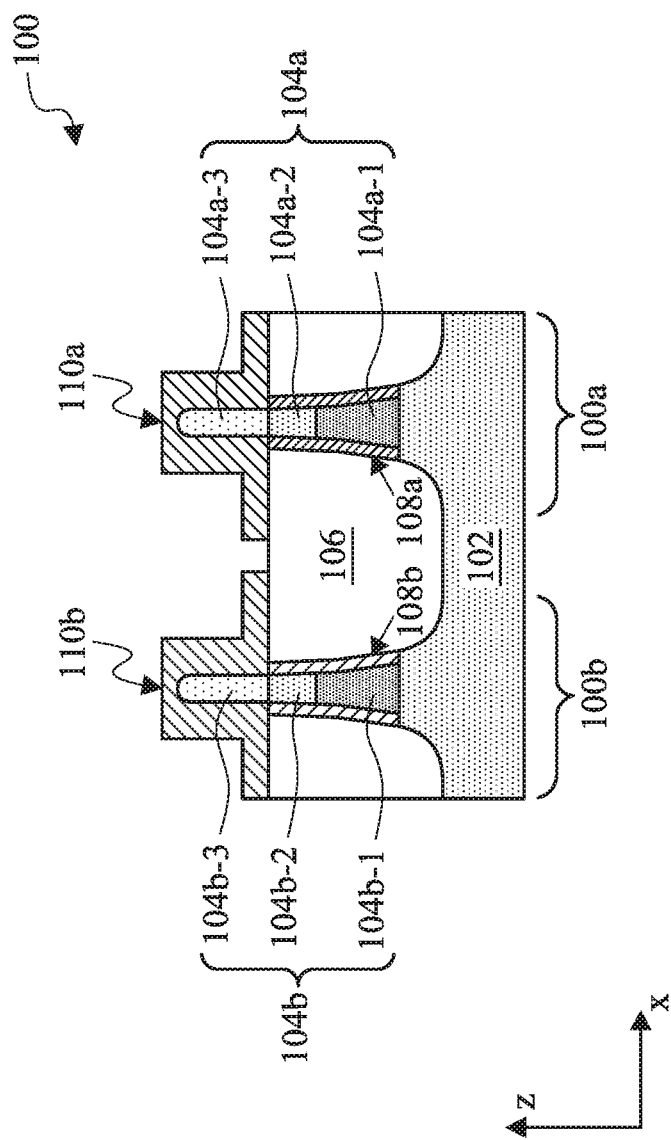

FIGS. 1A-1C show perspective and cross-sectional views of a semiconductor device 100 constructed according to various aspects of the present disclosure. As will be shown, the device 100 illustrates a p-type FinFET and an n-type FinFET in one region of a substrate. This is provided for simplification and ease of understanding and does not necessarily limit the embodiment to any number of devices, any number of regions, or any configurations of regions. Furthermore, the FinFET device 100 may be an intermediate device fabricated during processing of an integrated circuit (IC), or a portion thereof, that may comprise static random access memory (SRAM) and/or other logic circuits, passive components such as resistors, capacitors, and inductors, and active components such as p-type FETs, n-type FETs, double gate FETs, tri-gate FETs, FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Referring to FIG. 1A, the device 100 includes a substrate 102 and an isolation structure 106 over the substrate 102. The device 100 includes a p-type FinFET 100a and an n-type FinFET 100b formed over the substrate 102. The FinFETs 100a and 100b have similar structures and will be described collectively below. The FinFET 100a (100b) includes a fin 104a (104b) projecting from the substrate 102 upwardly (along the "z" direction) through the isolation structure 106. The FinFET 100a (100b) further includes a gate structure 110a (110b) over the isolation structure 106 and engaging the fin 104a (104b) on three sides thereof (top surface and sidewalls). In some embodiments, the gate structure 110a (110b) may engage the respective fins on only two sides, e.g., only the sidewalls of the fins. The FinFET 100a (100b) further includes a doped material layer 108a (108b) between the fin 104a (104b) and the isolation structure 106. The various elements of the device 100 will be further described in the following sections.

The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In the present embodiment, the fins 104a and 104b are formed through a variety of processes including photolithography, etching, and epitaxial growth processes, which will be further described in details later.

The isolation structure 106 may be formed of silicon oxide, silicon nitride, silicon oxynitride, fluoride-doped silicate glass (FSG), a low-k dielectric material, and/or other suitable insulating material. The isolation structure 106 may be shallow trench isolation (STI) features. In an embodiment, the isolation structures 106 is formed by etching trenches in the substrate 102, e.g., as part of the fins 104a and 104b formation process. The trenches may then be filled with isolating material, followed by a chemical mechanical planarization (CMP) process. Other isolation structure such as field oxide, LOCal Oxidation of Silicon (LOCOS), and/or other suitable structures are possible. The isolation structure 106 may include a multi-layer structure, for example, having one or more thermal oxide liner layers.

The fins, 104a and 104b, and the gate structures, 110a and 110b, are further illustrated in FIG. 1B, which is a cross-sectional view of the device 100 along the "1-1" line of FIG. 1A. Referring to FIG. 1B, the fin 104a (104b) includes three regions along the "y" direction: two source/drain regions 114a (114b) and a channel region 112a (112b). The gate structure 110a (110b) includes a gate stack 116a (116b) and a spacer feature 118a (118b) on sidewalls of the gate stack 116a (116b). In various embodiments, each of the gate stacks 116a and 116b includes a multi-layer structure. In one example, each of them includes an interfacial layer and a poly-silicon layer. In another example, each of them includes an interfacial layer, a high-k dielectric layer, a barrier layer, a work function metal layer, and a metal fill layer. Various other embodiments of the gate stacks 116a and 116b are possible. The gate stacks 116a and 116b may be formed using either a "gate-first" or a "gate-last" method. In embodiments, the spacer feature 118a (118b) includes a dielectric material, such as silicon nitride or silicon oxynitride and is formed by one or more deposition and etching processes. The gate structure 110a (110b) engages the fin 104a (104b) at the channel region 112a (112b). In an exemplary mode of operation of the FinFET 100a (100b), currents may flow between the two source/drain regions 114a (114b) under the control of the gate structure 110a (110b) by applying a voltage thereto.

FIG. 1C is a cross-sectional view of the device 100 along the "2-2" line of FIG. 1A. Referring to FIG. 1C, the fin 104a (104b) is divided into at least two vertical portions (or sections) along the "z" direction, one above the isolation structure 106 and another one surrounded by the isolation structure 106. In the embodiment as shown, the fin 104a includes three vertical portions: 104a-1, 104a-2, and 104a-3; and the fin 104b includes three vertical portions: 104b-1, 104b-2, and 104b-3. Specifically the fin portions 104a-3 and 104b-3 are above the isolation structure 106, while the fin portions 104a-2, 104a-1, 104b-2, and 104b-1 are surrounded by the isolation structure 106. In an embodiment, the fin portions 104a-2 and 104a-1 are merged into one. In an embodiment, the fin portions 104b-2 and 104b-1 are merged into one. In various embodiments, the fins 104a and 104b may have the same or different configurations along the "z" direction. For example, the fin 104a may include two vertical portions while the fin 104b includes three vertical portions. In various embodiments, only the fin portions above the isolation structure 106, such as the fin portions 104a-3 and 104b-3, are under the direct control of the respective gate structures 110a and 110b. In a conventional FinFET, currents might flow in fin portions not under the direct control of a gate, causing punch-through. This is undesirable. The FinFETs 100a and 100b overcome such issue.

Still referring to FIG. 1C, the doped material layer 108a and 108b are located between the isolation structure 106 and the respective fins 104a and 104b. In the embodiment as shown, the device 100a is a p-type FinFET. To further this embodiment, the doped material layer 108a and the fin portions 104a-2 and 104a-1 each include an n-type dopant, such as phosphorous, that is opposite to the conductivity type of the source/drain regions 114a. The impurity level in the fin portions 104a-2 and 104a-1 are sufficiently high so as to stop any punch-through currents between the source/drain regions 114a. To further this embodiment, the fin portion 104a-3 is tuned to have compressive strain for enhancing carrier mobility in the channel region 112a (FIG. 1B).

In the embodiment as shown in FIG. 1C, the device 100b is an n-type FinFET. To further this embodiment, the doped material layer 108b and the fin portions 104b-2 and 104b-1 each include a p-type dopant, such as boron, that is opposite to the conductivity type of the source/drain regions 114b. The impurity level in the fin portions 104b-2 and 104b-1 are sufficiently high so as to stop any punch-through currents between the source/drain regions 114b. To further this embodiment, the fin portion 104b-3 is tuned to have tensile strain for enhancing carrier mobility in the channel region 112b (FIG. 1B).

In various embodiments, the impurities in the fin portions 104a-2, 104a-1, 104b-2, and 104b-1 are introduced by a solid phase diffusion (SPD) method, which will be described in greater details later. In the SPD method, impurities from the doped material layers 108a and 108b are diffused into the fin portions 104a-2, 104a-1, 104b-2, and 104b-1 through an annealing process, keeping the fin portions 104a-3 and 104b-3 substantially free of the respective impurities. As a result, the carrier mobility and the proper channel stress (either compressive or tensile) in the fin portions 104a-3 and 104b-3 are advantageously maintained. This greatly enhances the electrical performance of the FinFETs 100a and 100b. A method of forming the device 100 will now be discussed in conjunction with FIGS. 2-3R.

Figure 2:
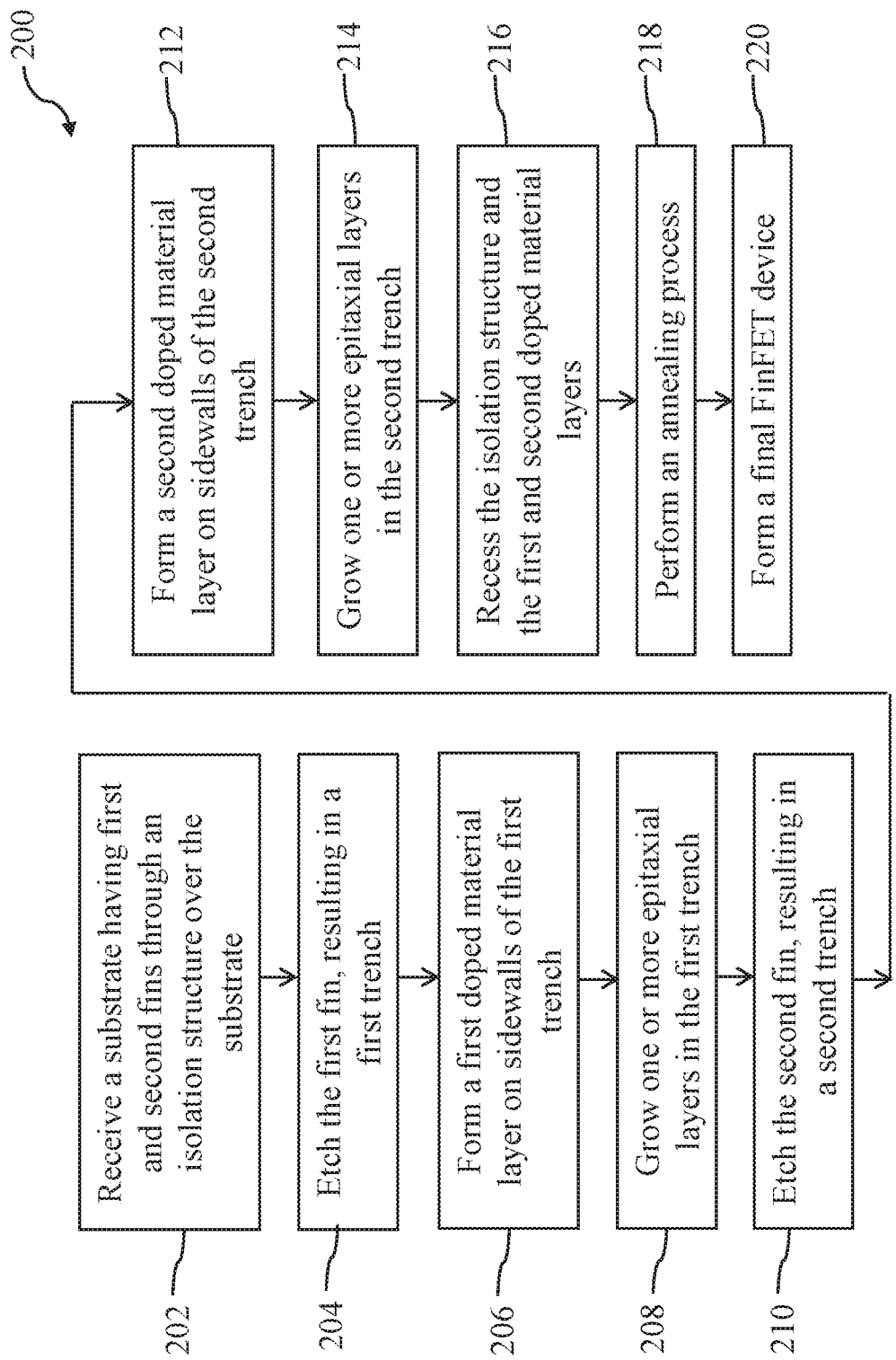
FIG. 2 shows a flow chart of a method of fabricating a semiconductor device, according to various aspects of the present disclosure.
Figure 3D:
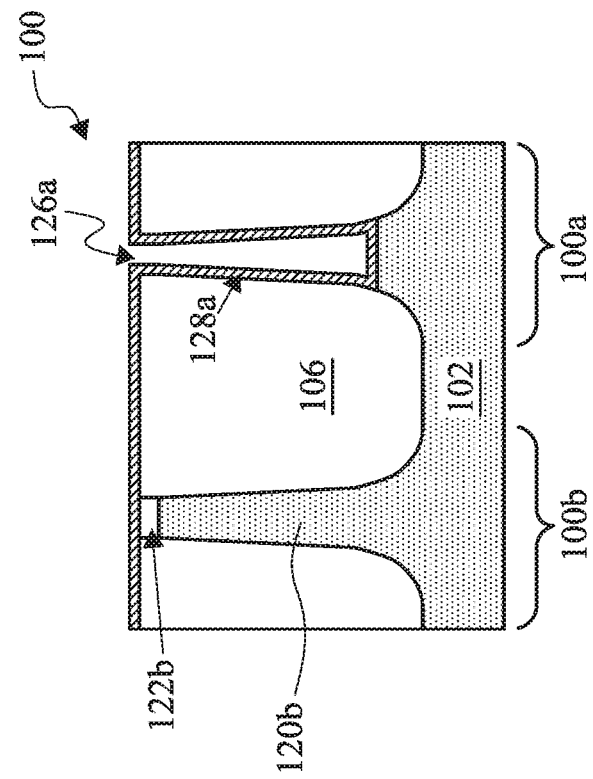
Figure 3C:
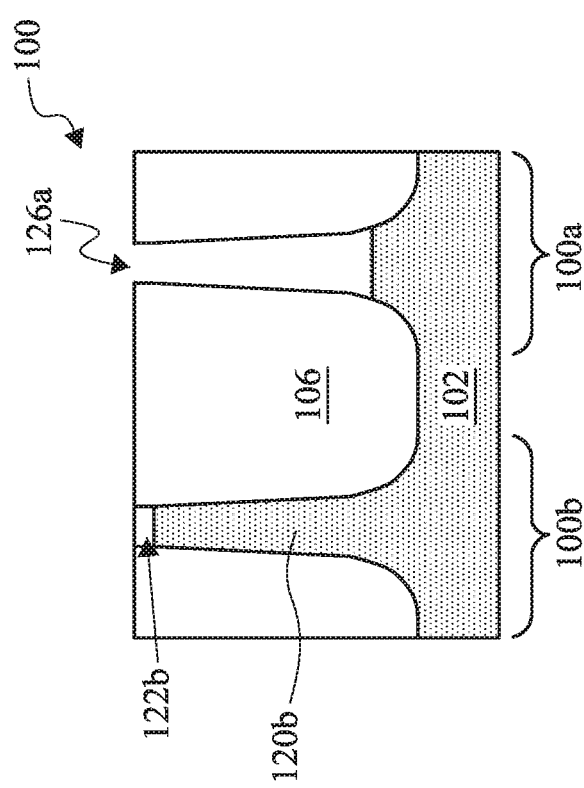

Referring now to FIG. 2, a flow chart of a method 200 is illustrated according to various aspects of the present disclosure in forming a semiconductor device, such as the semiconductor device 100 of FIGS. 1A-1C. The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 3A-3R that illustrate cross-sectional views of the semiconductor device 100 along the "2-2" line of FIG. 1A at various stages of the manufacturing.

At operation 202, the method 200 (FIG. 2) receives a substrate 102 with various structures formed therein and/or thereon. Referring to FIG. 3A, the device 100 includes a substrate 102 having two fins 120a and 120b projecting upwardly from the substrate 102. The two fins 120a and 120b are in two regions of the device 100 where two FinFETs 100a and 100b are going to form. The device 100 further includes an isolation structure 106 over the substrate 102 and separating the fins 120a and 120b. In an embodiment, the two fins 104a and 104b are fabricated using suitable processes including photolithography and etching processes. The photolithography process may include forming a photoresist (or resist) layer overlying the substrate 102, exposing the resist to a pattern, performing post-exposure bake processes, and developing the resist to form a resist pattern. The resist pattern is then used for etching a hard mask layer to form patterned hard masks 122a and 122b. Subsequently, the substrate 102 is etched using the patterned hard masks 122a and 122b as an etch mask, leaving the fins 120a and 120b on the substrate 102. The various etching processes can include dry etching, wet etching, reactive ion etching (RIE), and/or other suitable processes. After the fins 120a and 120b have been fabricated, an isolating material is deposited over the substrate 102 and fills the trenches. Thereafter, the isolating material is recessed to form the isolation structure 106. In an embodiment, the isolating material is recessed using a CMP process where the patterned hard masks 122a and 122b acts as a CMP stop. In the present embodiment, the width of the fins 120a and 120b are greater than the width of the fins 104a and 104b (FIG. 1C) for reasons discussed later. From a process point of view, this advantageously enlarges the process window for fin formation photolithography.

At operation 204, the method 200 (FIG. 2) etches the fin 120a to form a trench 126a. Referring to FIG. 3B, a masking element 124 is formed to cover the region for the FinFET 100b while the region for the FinFET 100a is exposed. The masking element 124 may be formed by a photolithography process discussed above. Then, one or more etching processes are performed to selectively remove the hard mask 122a and the fin 120a, resulting in the trench 126a. The etching processes can include dry etching, wet etching, reactive ion etching (RIE), and/or other suitable processes. As shown in FIG. 3B, the trench 126a is surrounded by the isolation structure 106 as trench sidewalls and the substrate 102 (or a stub of the fin 120a) as a trench bottom. The sidewalls and the bottom surface of the trench 126a form a sidewall angle $\Theta_{trench-a}$. The trench 126a has an opening width $W_{trench-a}$. In various embodiments, the opening of the trench 126a is wide enough and the sidewalls of the trench 126a are upright enough so that the surfaces of the trench 126a can be accessed for forming material layer(s) thereon. In an example, $W_{trench-a}$ is greater than or equal to 7 nm and $\Theta_{trench-a}$ is greater than or equal to about 80 degrees. After the trench 126a has been etched, the masking element 124 is removed (FIG. 3C), for example, by a stripping, ashing, or other suitable method. One or more cleaning processes may be performed to clean the trench 126a and make it ready for subsequent processes.

Figure 3E:
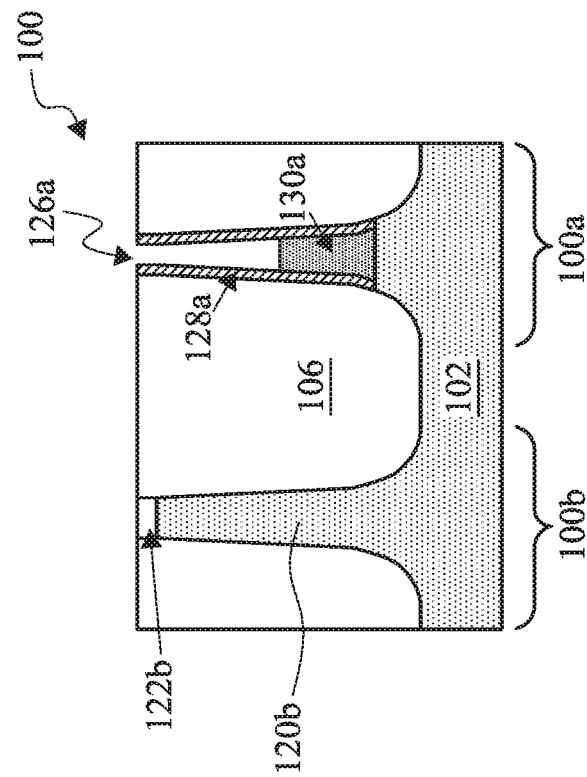

At operation 206, the method 200 (FIG. 2) forms a doped material layer 128a on sidewalls of the trench 126a. In an embodiment, the doped material layer 128a includes an n-type dopant, such as phosphorous. In an embodiment, the doped material layer 128a is an n-type doped oxide layer, such as phosphosilicate glass (PSG). The dopant concentration in the material layer 128a may range from about $1 \times 10^{18}$ to about $3 \times 10^{22}$. Operation 206 may involve multiple processes. In an embodiment, the doped material layer 128a is first deposited as a blanket layer over the device 100 (FIG. 3D), covering the top surface of the isolation structure 106, and the sidewalls and the bottom surface of the trench 126a. For example, the doped material layer 128a may be deposited using CVD or other suitable methods and may have a thickness about few nanometers (e.g., ranging from about 1 nm to about 10 nm). After the blanket layer 128a is formed, an etching process is performed to remove the doped material from the top surface of the isolation structure 106 and the bottom surface of the trench 126a. The doped material on the sidewalls of the trench 126a substantially remains, as shown in FIG. 3E. The etching process can be dry etching, RIE, or any other directional (anisotropic) etching method. The opening of the trench 126a becomes smaller as a result of the formation of the doped material layer 128a ($W'_{trench-a} < W_{trench-a}$).

Figure 3F:
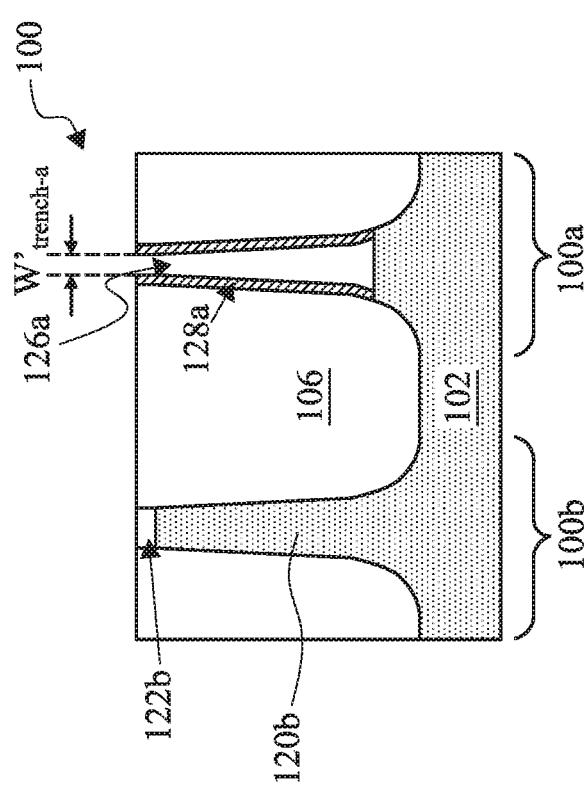
Figure 3G:
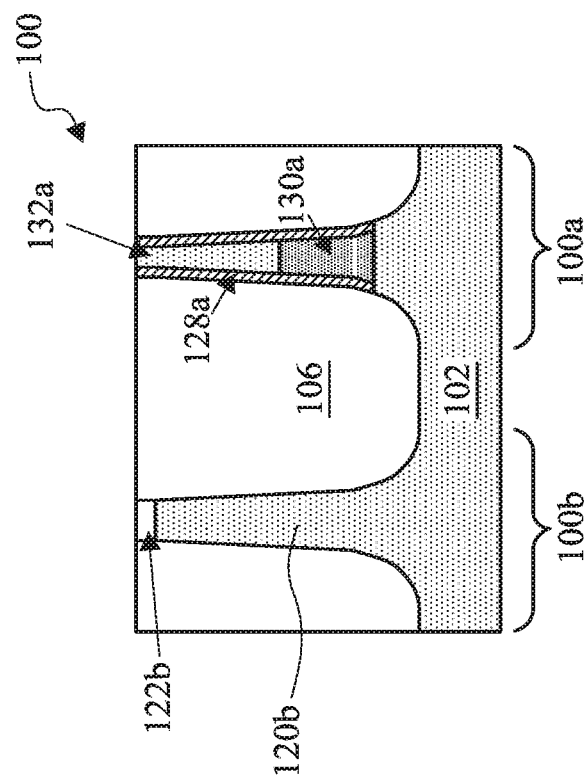
Figure 3H:
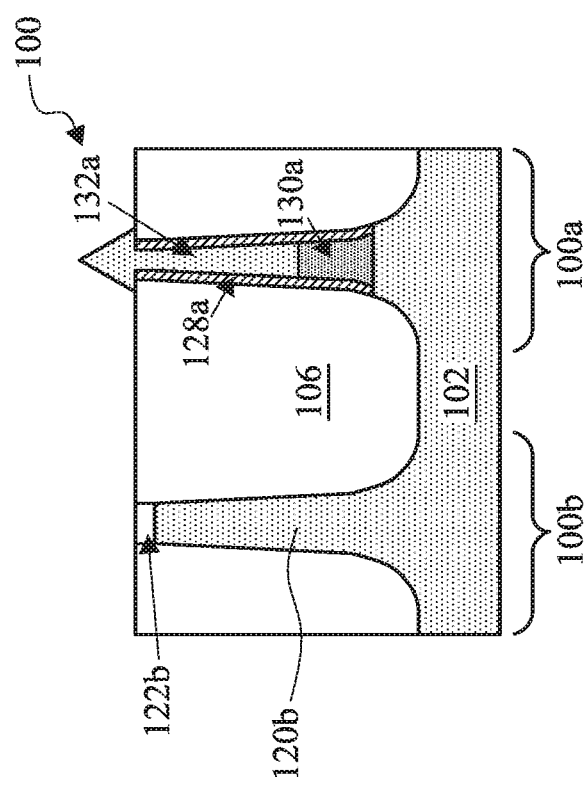

At operation 208, the method 200 (FIG. 2) grows one or more epitaxial layers in the trench 126a. In the present embodiment, two layers of epitaxy will be grown. In other embodiments, one layer or more than two layers of epitaxy may be grown without departing from the inventive scope of the present disclosure. Referring to FIG. 3F, an epitaxial layer 130a is grown in the trench 126a, filling a bottom portion of the trench 126a. In an embodiment, the epitaxial layer 130a may be silicon or a silicon alloy such as silicon germanium or silicon carbide. Referring to FIG. 3G, another epitaxial layer 132a is grown in the trench 126a, interfacing with the epitaxial layer 130a. In an embodiment, the epitaxial layer 132a may be silicon or a silicon alloy such as silicon germanium. Referring to FIG. 3H, a CMP process is performed to remove excessive portion of the epitaxial layer 132a, planarizing the top surface of the device 100.

In the present embodiment, the epitaxial layer 132a is also referred to as the channel epitaxial layer 132a because the channel region 112a (FIG. 1B) of the FinFET 100a will be formed in a top portion of the epitaxial layer 132a. In the present embodiment, the channel epitaxial layer 132a is tuned to have compressive strain so as to enhance carrier mobility in the p-type FinFET 100a. Compressive strain may be created by having a larger crystalline lattice constant in the epitaxial layer 132a than in the epitaxial layer 130a. In one example, the epitaxial layer 132a is silicon germanium and the epitaxial layer 130a is silicon. In another example, the epitaxial layer 132a is silicon and the epitaxial layer 130a is silicon carbide. In yet another example, both the epitaxial layers 132a and 130a are silicon germanium but the epitaxial layer 132a contains a higher ratio of germanium to silicon than the epitaxial layer 130a does. In the present embodiment, the epitaxial layer 130a is also referred to as a strain relaxation buffer (SRB) layer because it is located between the strained channel epitaxial layer 132a and the substrate 102 and it helps create and maintain the strain in the layer 132a. In embodiments, the SRB layer 130a may have a height of few nanometers to few microns (e.g. ranging from about 10 nm to about 3 μm). In various embodiments, the epitaxial layers 130a and 132a may each be formed by one or more selective epitaxial growth (SEG) processes. In an embodiment, the SEG process is a low pressure chemical vapor deposition (LPCVD) process using a silicon-based precursor gas.

Figures 3I, 3J:
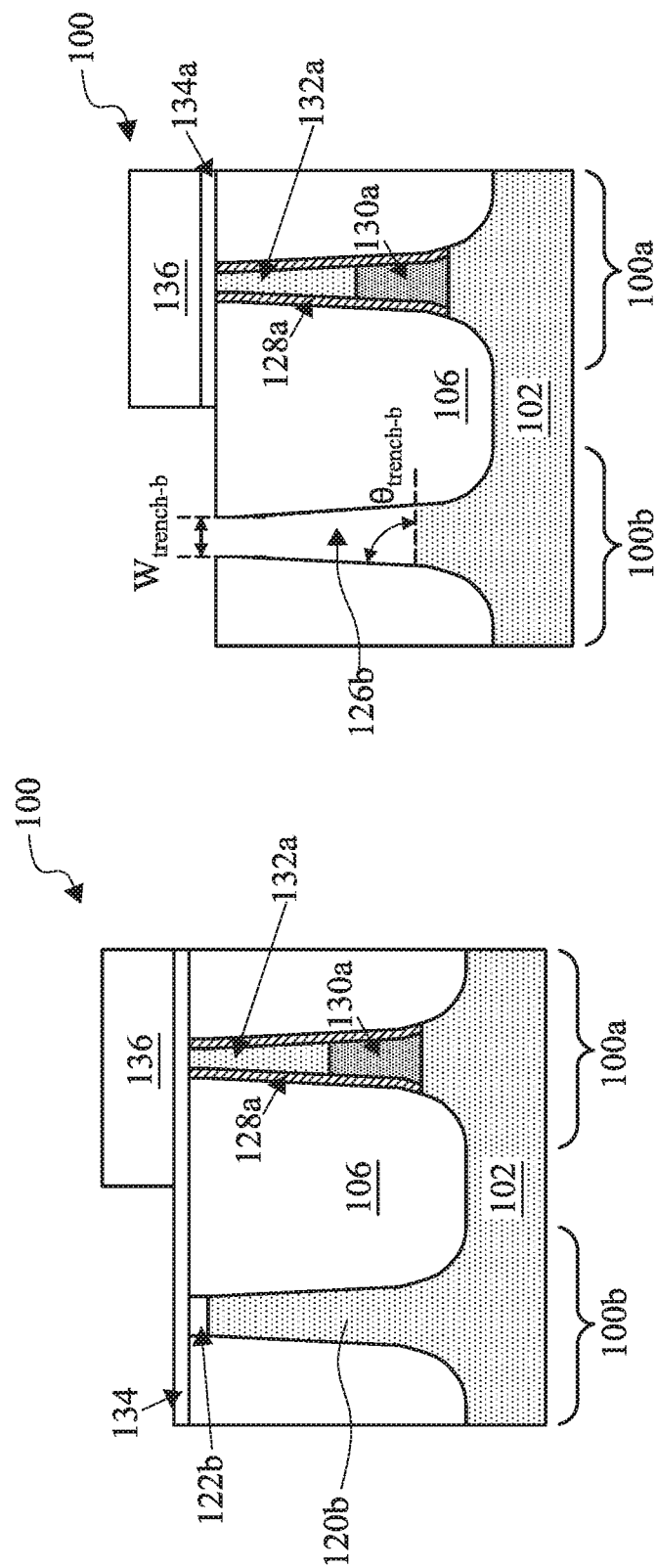

At operation 210, the method 200 (FIG. 2) etches the fin 120b to form a trench 126b (FIGS. 3I and 3J). Operation 210 is similar to operation 204 in many respects. Therefore, it is briefly described below for the sake of simplicity. Referring to FIG. 3I, a hard mask layer 134 is formed over the top surface of the device 100. A masking element 136, such as a patterned resist, is formed over the FinFET 100a, covering the region for the FinFET 100a. Referring to FIG. 3J, the device 100 is etched using the masking element 136 as an etch mask. The etching process selectively removes a portion of the hard mask layer 134, the hard mask 122b, and the fin 120b, resulting in the trench 126b. A portion of the hard mask layer 134 remains over the FinFET 100a as a hard mask 134a. As shown in FIG. 3J, the trench 126b is surrounded by the isolation structure 106 as trench sidewalls and the substrate 102 (or a stub of the fin 120b) as a trench bottom. The sidewalls and the bottom surface of the trench 126b form a sidewall angle $\Theta_{trench-b}$. The trench 126b has an opening width $W_{trench-b}$. In various embodiments, the opening of the trench 126b is wide enough and the sidewalls of the trench 126b are upright enough so that the surfaces of the trench 126b can be accessed for forming material layer(s) thereon. In an example, $W_{trench-b}$ is greater than or equal to 7 nm and $\Theta_{trench-b}$ is greater than or equal to about 80 degrees.

Figure 3L:
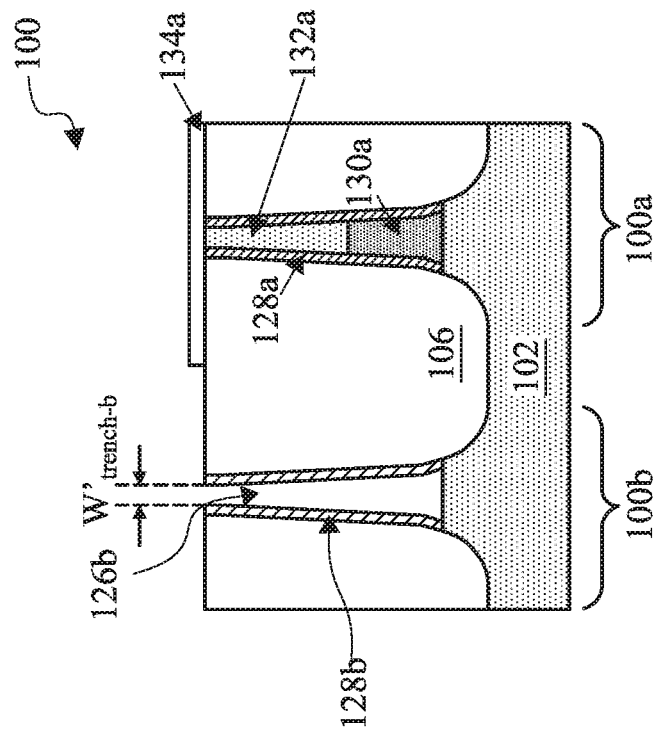
Figure 3K:
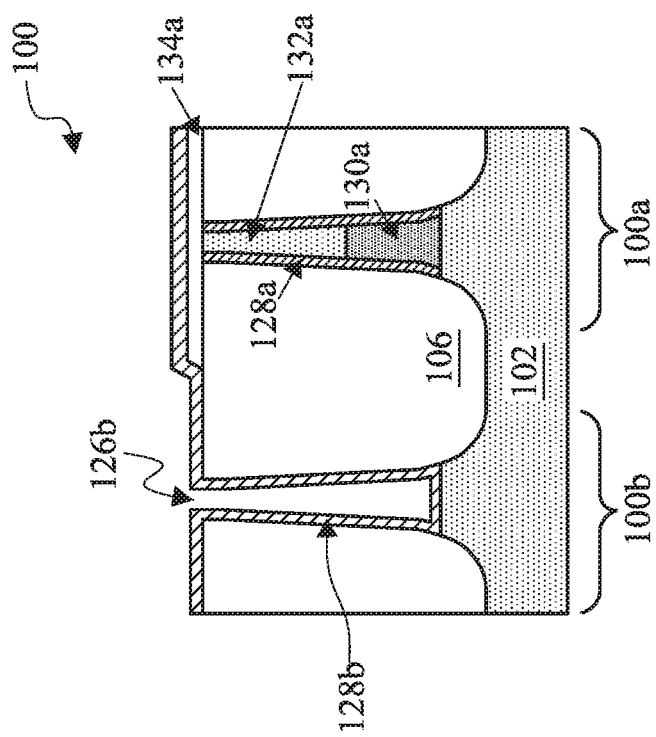

At operation 212, the method 200 (FIG. 2) forms a doped material layer 128b on sidewalls of the trench 126b. Operation 212 is similar to operation 206 in many respects. Therefore, it is briefly described below for the sake of simplicity. Referring to FIG. 3K, the masking element 136 has been removed and a blanket material layer 128b is formed over the device 100, particularly on the sidewalls of the trench 126b. In the present embodiment, the doped material layer 128b includes a p-type dopant, such as boron. The dopant concentration in the material layer 128b may range from about $1\times10^{18}$ to about $3\times10^{22}$. In an embodiment, the doped material layer 128b is a p-type doped oxide layer, such as borosilicate glass (BSG). The blanket doped material layer 128b may be formed by a deposition method discussed with reference to FIG. 3D. In embodiments, the doped material layer 128b may have a thickness about few nanometers (e.g., ranging from about 1 nm to about 10 nm). Referring to FIG. 3L, an anisotropic etching process is performed to remove the material layer 128b from the top surface of the device 100 and from the bottom surface of the trench 126b while the doped material layer 128b on the sidewalls of the trench 126b substantially remains. The opening of the trench 126b becomes smaller as a result of the formation of the doped material layer 128b ($W'_{trench-b} < W_{trench-b}$).

Figure 3N:
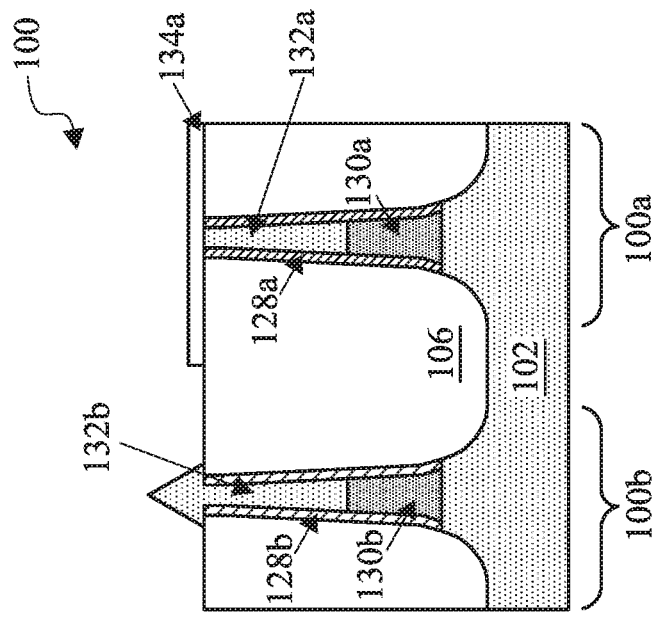
Figure 3M:
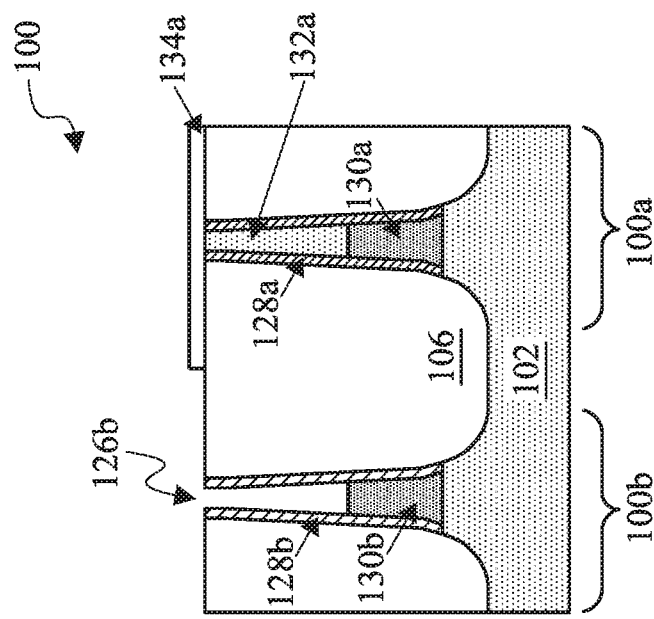

At operation 214, the method 200 (FIG. 2) grows one or more epitaxial layers in the trench 126b. Operation 214 is similar to operation 208 in many respects. Therefore, it is briefly described below for the sake of simplicity. In the present embodiment, two layers of epitaxy will be grown. In other embodiments, one layer or more than two layers of epitaxy may be grown without departing from the inventive scope of the present disclosure. Referring to FIG. 3M, an epitaxial layer 130b is grown in the trench 126b. Referring to FIG. 3N, an epitaxial layer 132b is grown in the trench 126b, interfacing with the epitaxial layer 130b. Referring to FIG. 3O, the patterned hard mask 134a is removed (e.g. by a selective etching process or a CMP process) and a CMP process is performed to remove excessive material from the epitaxial layer 132b and to planarize a top surface 136 of the device 100.

In the present embodiment, the epitaxial layer 132b is also referred to as the channel epitaxial layer 132b and the epitaxial layer 130b is also referred to as the SRB layer 130b. In the present embodiment, the channel epitaxial layer 132b is tuned to have tensile strain so as to enhance carrier mobility in the n-type FinFET 100b. Tensile strain may be created by having a smaller crystalline lattice constant in the epitaxial layer 132b than in the epitaxial layer 130b. In one example, the epitaxial layer 132b is silicon and the epitaxial layer 130b is silicon germanium. In another example, the epitaxial layer 132b is silicon carbide and the epitaxial layer 130b is silicon. In yet another example, both the epitaxial layers 132b and 130b are silicon germanium but the epitaxial layer 132b contains a lower ratio of germanium to silicon than the epitaxial layer 130b does. In embodiments, the SRB layer 130b may have a height of few nanometers to few microns (e.g. ranging from about 10 nm to about 3 μm).

At operation 216, the method 200 (FIG. 2) recesses the isolation structure 106 and the doped material layers 128a and 128b. Referring to FIG. 3P, the isolation structure 106 is recessed to have a top surface 138. As a result of operation 216, portions of the epitaxial layers 132a and 132b are exposed. Specifically, a top portion of the epitaxial layer 132a, 132a-2, projects above the surface 138, while a bottom portion, 132a-1, is still surrounded by the isolation structure 106 and the doped material layer 128a. The epitaxial layer 132b is similarly exposed, with a top portion 132b-2 above the surface 138 and a bottom portion 132b-1 surrounded by the isolation structure 106 and the doped material layer 128b. In the present embodiment, the epitaxial layers 130a and 132a collectively constitute the fin 104a of FIG. 1C, while the epitaxial layers 130b and 132b collectively constitute the fin 104b of FIG. 1C. Therefore, FIG. 3P is also annotated with 104a-1/2/3 and 104b-1/2/3 to indicate matching parts. Even though not shown, in embodiments, the isolation structure 106 and the doped material layers 128a and 128b may be recessed such that the epitaxial layer 132a and 132b are fully exposed.

At operation 218, the method 200 (FIG. 2) performs an annealing process 140 to the device 100. Referring to FIG. 3Q, the annealing process 140 drives the dopants from the doped material layers 128a and 128b into the respective fin portions surrounded thereby. Therefore, it is also referred to as a solid phase diffusion method. Specifically, the n-type dopants in the material layer 128a are driven into the fin portions 104a-1 and 104a-2, and the p-type dopants in the material layer 128b are driven into the fin portions 104b-1 and 104b-2. The dopant level in the fin portions 104a-1, 104a-2, 104b-1, and 104b-2 can be controlled by the annealing condition and the dopant level in the respective doped material layers 128a and 128b. The annealing process 140 also activates the dopants in the respective fin portions. In various embodiments, the annealing process 140 may use rapid thermal annealing (RTA), flash annealing, sub-second annealing (SSA), micro-second annealing (uSSA), laser annealing, or other suitable annealing methods. In an example, the annealing process 140 is performed at a temperature greater than or equal to about 700 degrees Celsius and lower than about 1,300 degrees Celsius.

Referring to FIG. 3R, the fin portions 104a-2, 104a-1, 104b-2, and 104b-1 are properly doped to act as punch-through stoppers for the FinFETs 100a and 100b. Because the fin portions 104a-3 and 104b-3 are not surrounded by the doped material layers 128a and 128b, their purity remains substantially unchanged during the annealing process 140, providing desirable carrier mobility therein. This avoids the issue associated with traditional impurity implantation methods where the whole fin 104a and 104b are implanted with impurities. Furthermore, the strains (compressive or tensile) in the fin portion 104a-3 and 104b-3 remain substantially unchanged during the annealing process 140, further enhancing the carrier mobility therein. Still referring to FIG. 3R, the fin portions 104a-1, 104a-2, 104b-1, and 104b-2 have high levels of dopant concentration, forming two super steep retrograde wells. Further, the fins 104a and 104b have smaller dimensions than the initial fins 120a and 120b due to the presence of the doped material layers 128a and 128b. Thus, the initial fins 120a and 120b can be made larger than those in conventional FinFET fabrication methods, thereby enhancing the process window of the present disclosure.

At operation 220, the method 200 (FIG. 2) performs further processes to complete the fabrication of the FinFETs 100a and 100b. In an embodiment, operation 220 forms the gate structures 110a and 110b (FIGS. 1A and 1B) using either a "gate-first" or a "gate-last" process. Further, operation 220 may form epitaxial source/drain features in the source/drain regions 114a and 114b (FIG. 1B) and may form an inter-layer dielectric (ILD) layer over the isolation structure 106, the fins 104a and 104b, and the gate structures 110a and 110b. Further, operation 220 may form various conductive features, such as contacts, vias, and interconnects, so as to connect the FinFETs 100a and 100b to other portions of the device 100 to form a complete integrated circuit.

Figures 4A, 4B:
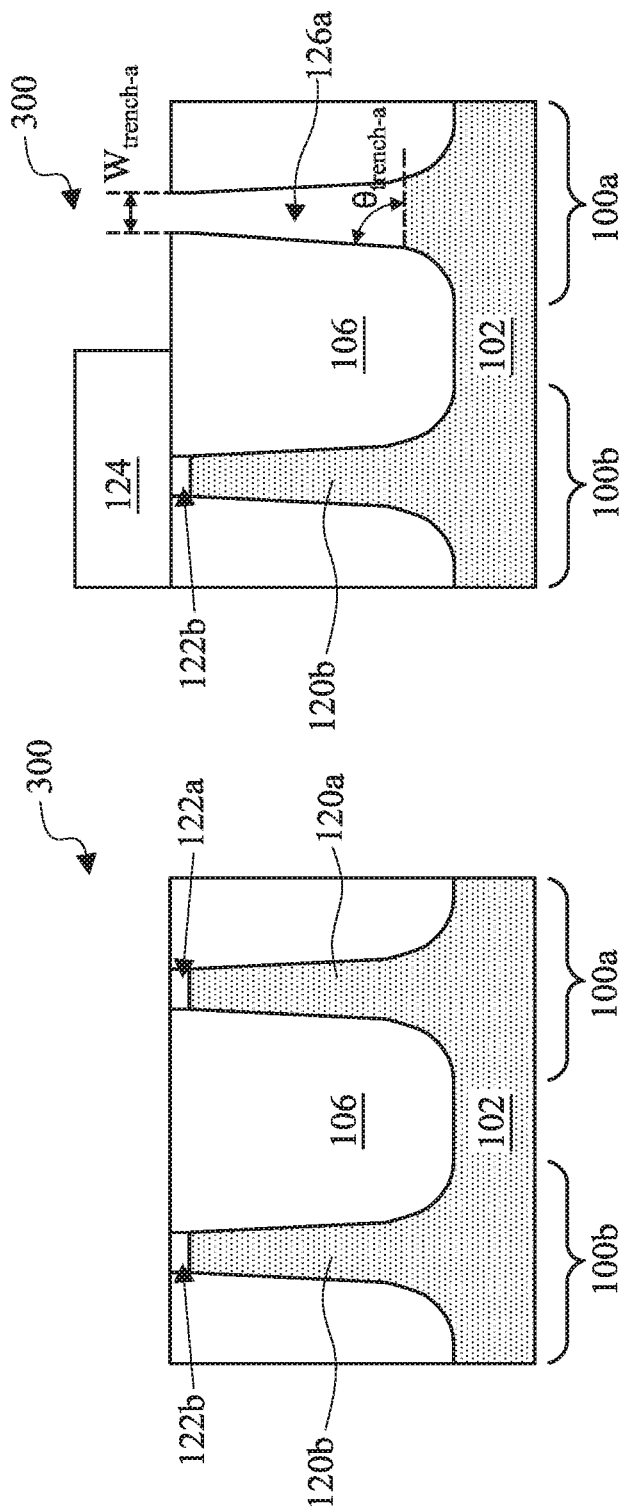
Figure 4C:
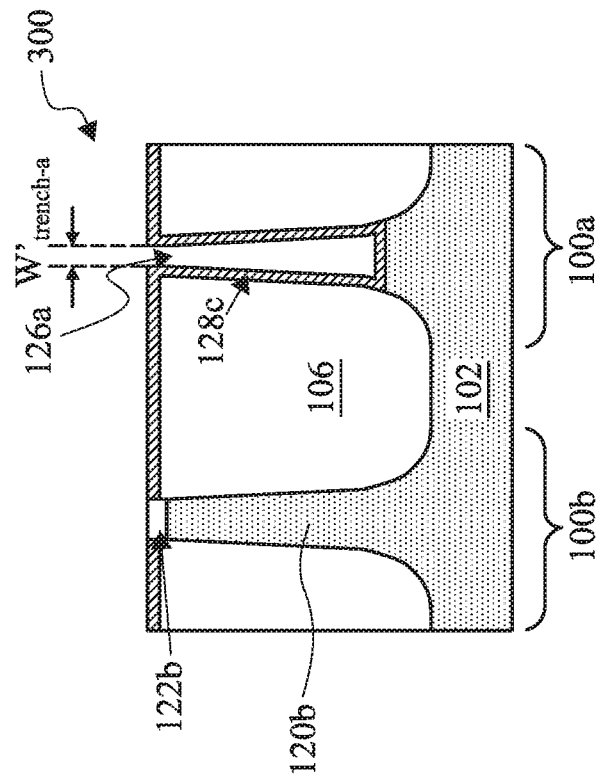
Figure 4D:
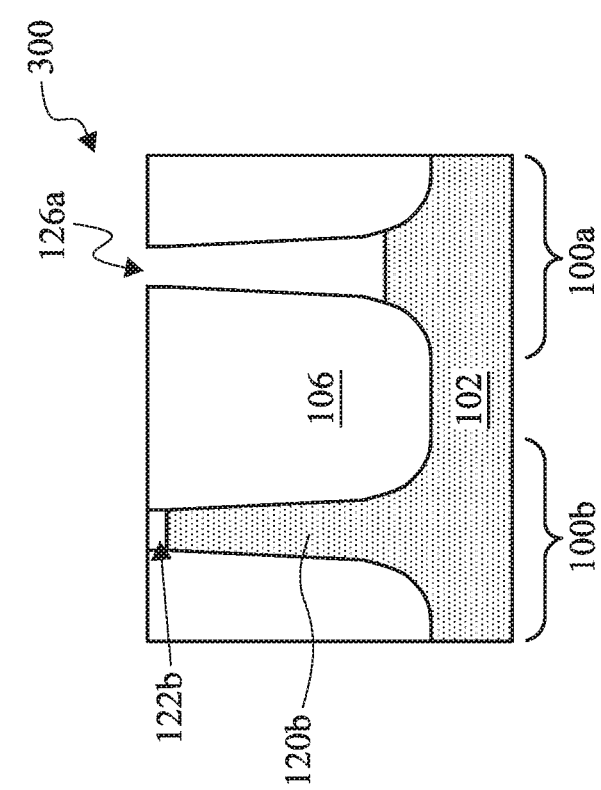
Figure 4H:
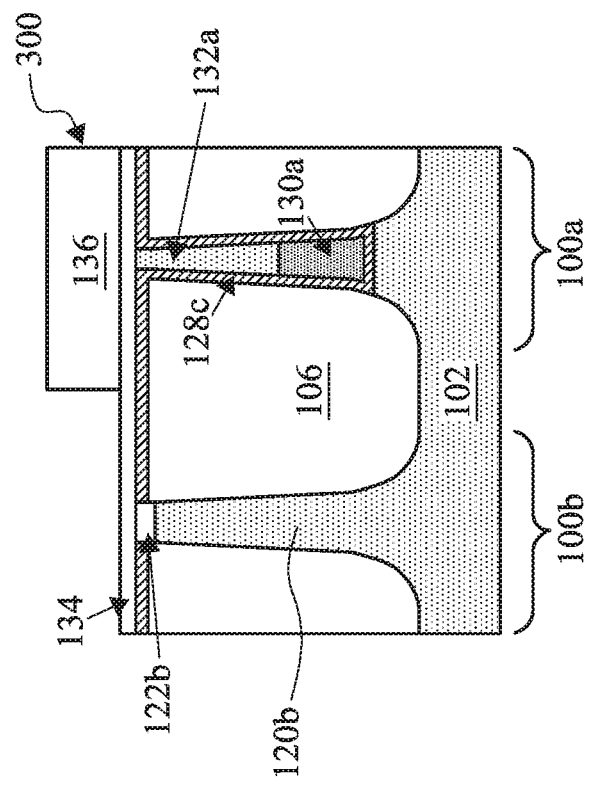
Figure 4G:
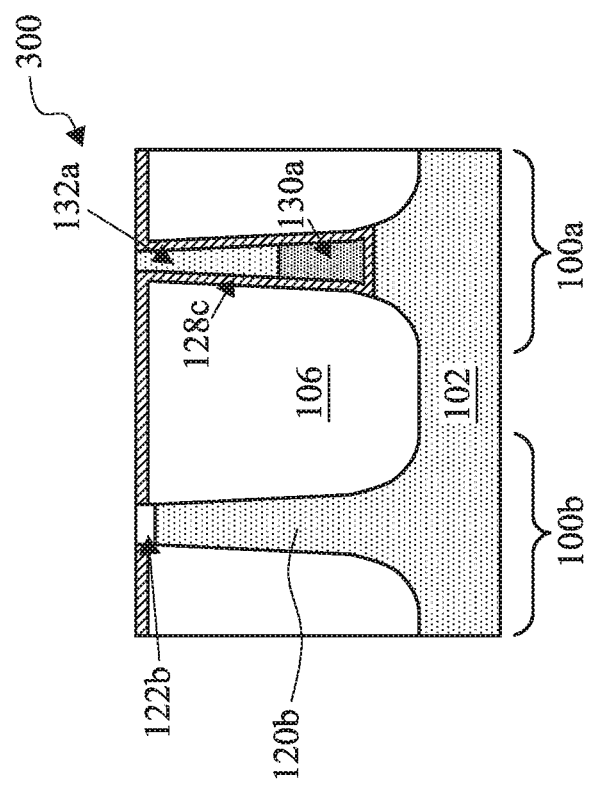
Figure 4K:
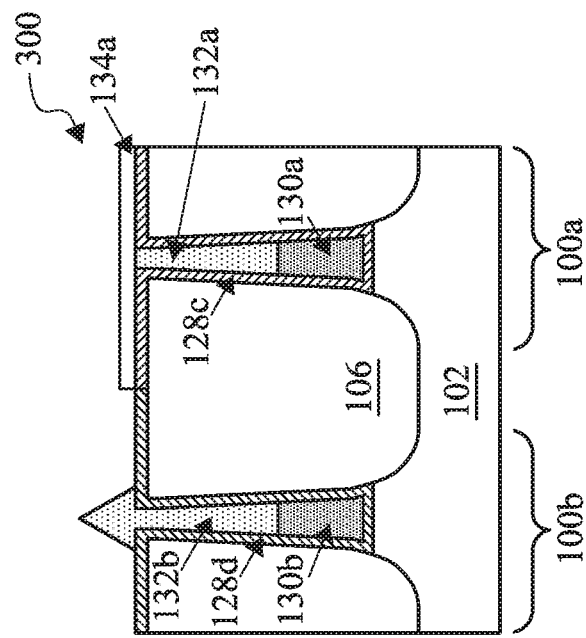
Figure 4L:
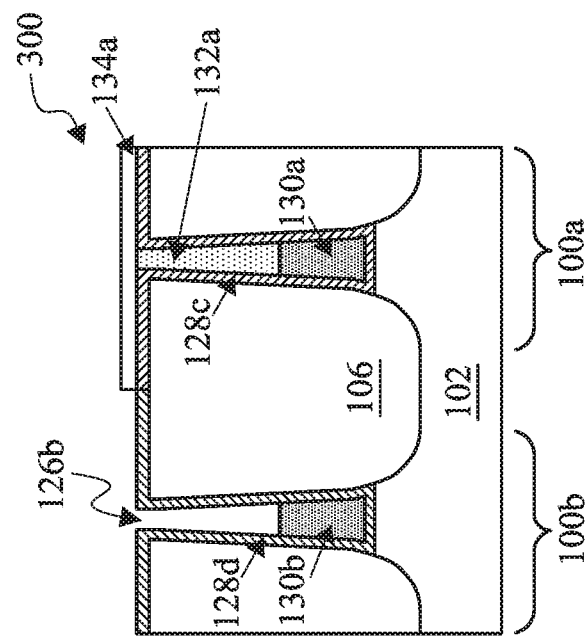
Figures 4O, 4P:
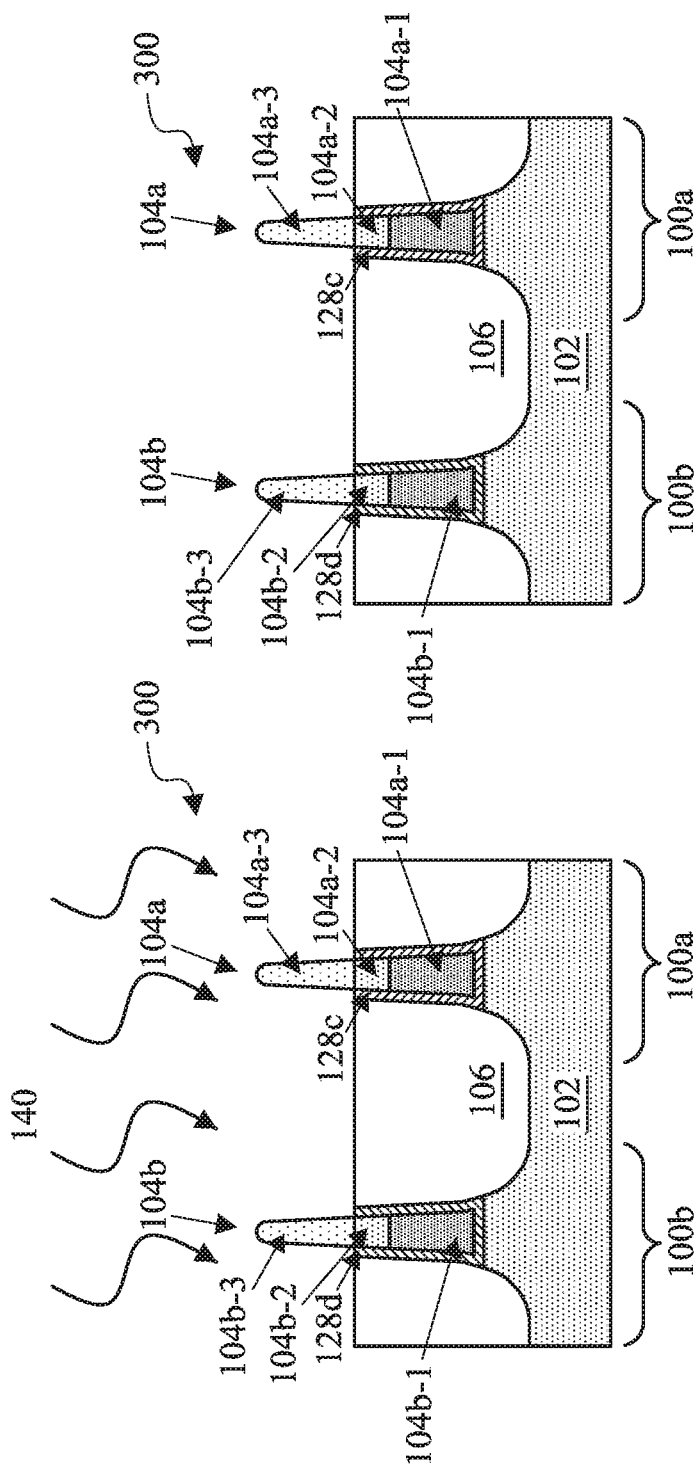

FIGS. 4A-4P illustrate cross-sectional views of a semiconductor device 300 formed with another embodiment of the method 200. The semiconductor device 300 is similar to the semiconductor device 100. Therefore, reference numerals for the device 100 are repeated to show the same or similar features in the device 300. Furthermore, some descriptions of the device 300 are abbreviated or omitted by referring to the descriptions of the device 100 for the sake of simplicity.

At operation 202, the method 200 (FIG. 2) receives the device 300 as shown in FIG. 4A. Referring to FIG. 4A, the device 300 includes a substrate 102, two fins 120a and 120b, an isolation structure 106, and patterned hard masks 122a and 122b. These features are the same or similar to those in FIG. 3A.

At operation 204, the method 200 (FIG. 2) etches the fin 120a to form a trench 126a. Referring to FIG. 4B, a masking element 124 is formed to cover the region for the FinFET 100b, and the trench 126a is formed by one or more etching processes. The trench 126a has an opening width $W_{trench-a}$. The sidewalls and the bottom surface of the trench 126a form a sidewall angle $\Theta_{trench-a}$. The materials and processes for forming the masking element 124 and the trench 126a are the same or similar to those described with reference to FIG. 3B. Referring to FIG. 4C, the masking element 124 is removed, for example, by a stripping, ashing, or other suitable method. One or more cleaning processes may be performed to clean the trench 126a and make it ready for subsequent processes.

At operation 206, the method 200 (FIG. 2) forms a doped material layer 128c on the sidewalls of the trench 126a. Referring to FIG. 4D, in the present embodiment, the doped material layer 128c is formed by plasma doping an n-type dopant into the isolation structure 106, including the sidewalls of the trench 126a. The plasma doping process uses extremely high dopant concentration so that the doped layer 128c can be used as a solid phase diffusion layer in a later operation. The doping process is conformal, i.e., the various surfaces of the device 300 are near uniformly doped. As illustrated in FIG. 4D, the top surface of the isolation structure 106 and the bottom surface of the trench 126a are also doped by the same process. In embodiments, these doped areas do not affect the device's performance and therefore are not specifically removed at this stage. The dimensions of the trench 126a remain substantially the same before and after the doping process, i.e., $W'_{trench-a}$ is about the same as $W_{trench-a}$. Essentially, the operation 206 turns the sidewalls of the trench 126a into the doped material layer 128c.

At operation 208, the method 200 (FIG. 2) grows one or more epitaxial layers in the trench 126a. FIG. 4E shows that an epitaxial layer 130a is grown in the trench 126a. Even though the bottom of the trench 126a is doped, its crystalline structure remains the same and still supports the growth of the epitaxial layer 130a. FIG. 4F shows that an epitaxial layer 132a is grown in the trench 126a over the epitaxial layer 130a. FIG. 4G shows that a CMP process is performed to remove excessive portions of the epitaxial layer 132a. These operations are similar to those described with reference to FIGS. 3F, 3G, and 3H.

At operation 210, the method 200 (FIG. 2) etches the fin 120b to form a trench 126b (FIGS. 4H and 4I). FIG. 4H shows that a hard mask layer 134 is formed over the top surface of the device 100 and a masking element 136 is formed over the FinFET 100a. FIG. 4I shows that the hard mask layer 134 is patterned, resulting in a patterned hard mask 134a, and the trench 126b is formed by one or more etching processes. The sidewalls and the bottom surface of the trench 126b form a sidewall angle $\Theta_{trench-b}$. The trench 126b has an opening width $W_{trench-b}$. These operations are similar to those described with reference to FIGS. 3I and 3J.

At operation 212, the method 200 (FIG. 2) forms a doped material layer 128d on the sidewalls of the trench 126b. Referring to FIG. 4J, in the present embodiment, the doped material layer 128d is formed by plasma doping a p-type dopant into the isolation structure 106, including the sidewalls of the trench 126b. This process is similar to operation 206 but for different dopant species and their appropriate dopant concentration levels. The dimensions of the trench 126b remain substantially the same before and after the doping process, i.e., $W'_{trench-b}$ is about the same as $W_{trench-b}$.

At operation 214, the method 200 (FIG. 2) grows one or more epitaxial layers in the trench 126b. FIG. 4K shows that an epitaxial layer 130b is grown in the trench 126b. FIG. 4L shows that an epitaxial layer 132b is grown in the trench 126b over the epitaxial layer 130b. FIG. 4M shows that the patterned hard mask 134a is removed and a CMP process is performed to remove excessive portions of the epitaxial layer 132b and to planarize a top surface 136 of the device 300. These operations are similar to those described with reference to FIGS. 3M, 3N, and 3O.

At operation 216, the method 200 (FIG. 2) recesses the isolation structure 106 and the doped material layers 128a and 128b. FIG. 4N shows that top portions of the epitaxial layers 132a and 132b are exposed. In embodiments, the operation 216 may fully expose the epitaxial layers 132a and 132b. The device 300 (FIG. 4N) is substantially similar to the device 100 (FIG. 3P). One difference is that the doped material layers 128a and 128b may be formed by deposition methods while the doped material layers 128c and 128d may be formed by plasma doping methods.

At operation 218, the method 200 (FIG. 2) performs an annealing process 140 to the device 300. Referring to FIG. 4O, the annealing process 140 drives the dopants from the doped material layers 128c and 128d into the respective fin portions surrounded thereby. The annealing process 140 is similar to what is described with reference to FIG. 3Q. Referring to FIG. 4P, the fin portions 104a-2, 104a-1, 104b-2, and 104b-1 are properly doped to act as punch-through stoppers for the FinFETs 100*a* and 100*b*. The strains (compressive or tensile) in the fin portion 104*a*-3 and 104*b*-3 remain substantially unchanged during the annealing process 140, enhancing the carrier mobility therein. The fins 104*a* and 104*b* have about the same dimensions as the initial fins 120*a* and 120*b* (FIG. 4A) because the doped material layers 128*c* and 128*d* are formed by plasma doping the isolation structure 106.

At operation 220, the method 200 (FIG. 2) performs further processes to complete the fabrication of the FinFETs 100*a* and 100*b* for the device 300.

Although not intended to be limiting, one or more embodiments of the present disclosure provide many benefits to a semiconductor device and the formation thereof. For example, embodiments of the present disclosure provide structures of and methods for bulk FinFETs having punch-through stoppers underneath channel fins. The punch-through stoppers are formed using a solid phase diffusion (SPD) method, which preserves purity and stress in the channel fins. The dopant level in the punch-through stoppers can be flexibly adjusted by controlling the dopant level of the solid doping source and the annealing conditions of the SPD process. Another benefit of some embodiments of the present disclosure is that initial fins can be formed with larger dimensions than the final fins, which enlarges process window. Various embodiments of the present disclosure can be implemented with low complexity and low manufacturing cost.

In one exemplary aspect, the present disclosure is directed to a method of forming a semiconductor device. The method includes receiving a substrate having a fin projecting through an isolation structure over the substrate, etching a portion of the fin, resulting in a trench. The method further includes forming a doped material layer on sidewalls of the trench and growing at least one epitaxial layer in the trench. The method further includes recessing the isolation structure and the doped material layer, leaving a first portion of the at least one epitaxial layer over the isolation structure and a second portion of the at least one epitaxial layer surrounded by the doped material layer and the isolation structure. The method further includes performing an annealing process, thereby driving dopants from the doped material layer into the second portion of the at least one epitaxial layer.

In another exemplary aspect, the present disclosure is directed to a method of forming a semiconductor device. The method includes receiving a substrate having first and second fins projecting through an isolation structure over the substrate. The method further includes etching a portion of the first fin, resulting in a first trench; forming a first material layer on sidewalls of the first trench, the first material layer having an n-type dopant; and growing a first epitaxial layer over a first strain relaxation buffer (SRB) layer in the first trench. The method further includes etching a portion of the second fin, resulting in a second trench; forming a second material layer on sidewalls of the second trench, the second material layer having a p-type dopant; and growing a second epitaxial layer over a second SRB layer in the second trench. The method further includes recessing the isolation structure and the first and second material layers, resulting in a first portion of the first epitaxial layer and a first portion of the second epitaxial layer over the isolation structure. The method further includes performing an annealing process, thereby driving the n-type dopant into the first SRB layer and driving the p-type dopant into the second SRB layer.

In another exemplary aspect, the present disclosure is directed to a semiconductor device. The semiconductor device includes a substrate; an isolation structure over the substrate; and at least one epitaxial layer over the substrate, wherein a first portion of the at least one epitaxial layer is over the isolation structure and a second portion of the at least one epitaxial layer is surrounded by the isolation structure. The semiconductor device further includes a doped material layer between the isolation structure and the second portion of the at least one epitaxial layer. The semiconductor device further includes a gate structure over the isolation structure and engaging the first portion of the at least one epitaxial layer.

In another exemplary aspect, the present disclosure is directed to a semiconductor device. The semiconductor device includes a substrate; an isolation structure over the substrate; and at least one semiconductor layer over the substrate, wherein a first portion of the at least one semiconductor layer is over the isolation structure and a second portion of the at least one semiconductor layer is surrounded by the isolation structure. The semiconductor device further includes a doped material layer between the isolation structure and the second portion of the at least one semiconductor layer.

In another exemplary aspect, the present disclosure is directed to a semiconductor device. The semiconductor device includes a substrate; an isolation feature over the substrate; a first semiconductor layer over the substrate and surrounded by the isolation feature; and a second semiconductor layer over the first semiconductor layer, wherein a top portion of the second semiconductor layer is above the isolation feature. The semiconductor device further includes a doped material layer between the isolation feature and the first semiconductor layer. The semiconductor device further includes a gate structure over the top portion of the second semiconductor layer.

In another exemplary aspect, the present disclosure is directed to a FinFET device. The FinFET device includes a substrate; an isolation feature over the substrate; a first SRB layer over the substrate and surrounded by the isolation feature, the first SRB layer having an n-type dopant; a first epitaxial layer over the first SRB layer, an upper portion of the first epitaxial layer being above the isolation feature, the first epitaxial layer having compressive strain; and a first material layer between the isolation feature and the first SRB layer, the first material layer having the n-type dopant. The FinFET device further includes a first gate structure over the upper portion of the first epitaxial layer. The FinFET device further includes a second SRB layer over the substrate and surrounded by the isolation feature, the second SRB layer having a p-type dopant; a second epitaxial layer over the second SRB layer, an upper portion of the second epitaxial layer being above the isolation feature, the second epitaxial layer having tensile strain; and a second material layer between the isolation feature and the second SRB layer, the second material layer having the p-type dopant. The FinFET device further includes a second gate structure over the upper portion of the second epitaxial layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a structure having a substrate, an isolation structure over the substrate, and a fin over the substrate and adjacent to the isolation structure;
   etching a portion of the fin, resulting in a trench;
   forming a doped material layer over bottom and sidewalls of the trench;
   growing at least one epitaxial layer over the doped material layer in the trench;
   recessing the isolation structure and the doped material layer, leaving a first portion of the at least one epitaxial layer surrounded by the doped material layer; and
   performing an annealing process, thereby driving dopants from the doped material layer into the first portion.

2. The method of claim 1, wherein the forming the doped material layer includes:
   performing a plasma doping process to the sidewalls of the trench and the bottom of the trench.

3. The method of claim 1, wherein the first portion provides a channel for an n-type field effect transistor and the doped material layer includes a p-type dopant.

4. The method of claim 3, wherein the doped material layer includes borosilicate glass (BSG).

5. The method of claim 1, wherein the growing at least one epitaxial layer includes:
   growing a lower epitaxial layer; and
   growing an upper epitaxial layer over the lower epitaxial layer, wherein the upper epitaxial layer has a different crystalline lattice constant than the lower epitaxial layer.

6. The method of claim 1, wherein the first portion provides a channel for a p-type field effect transistor and the doped material layer includes an n-type dopant.

7. The method of claim 6, wherein the doped material layer includes phosphosilicate glass (PSG).

8. A semiconductor device, comprising:
   a substrate;
   a semiconductor fin over the substrate;
   an isolation structure over the substrate and adjacent to the semiconductor fin; and
   a doped material layer between the isolation structure and the semiconductor fin and between the substrate and the semiconductor fin.

9. The semiconductor device of claim 8, wherein the doped material layer includes phosphorous.

10. The semiconductor device of claim 8, wherein the doped material layer includes boron.

11. The semiconductor device of claim 8, further comprising:
    a gate over the isolation structure and directly above the semiconductor fin and the dope material layer.

12. The semiconductor device of claim 8, wherein the semiconductor fin includes a lower layer and an upper layer.

13. The semiconductor device of claim 12, wherein the lower layer and the upper layer include different semiconductor materials.

14. The semiconductor device of claim 13, wherein the upper layer has a larger crystalline lattice constant than the lower layer.

15. The semiconductor device of claim 13, wherein the lower layer has a smaller crystalline lattice constant than the lower layer.

16. A semiconductor device, comprising:
    a substrate;
    a first semiconductor fin disposed over the substrate;
    a second semiconductor fin disposed over the substrate, wherein the second semiconductor fin includes a different type of dopant than the first semiconductor fin;
    an isolation structure over the substrate and adjacent to the first semiconductor fin and the second semiconductor fin;
    a first doped material layer between the isolation structure and the first semiconductor fin and between the substrate and the first semiconductor fin; and
    a second doped material layer between the isolation structure and the second semiconductor fin and between the substrate and the second semiconductor fin.

17. The semiconductor device of claim 16, wherein the first doped material layer and the first semiconductor fin include a same p-type dopant.

18. The semiconductor device of claim 17, wherein the first doped material layer includes a p-type doped oxide layer.

19. The semiconductor device of claim 16, wherein the second doped material layer and the second semiconductor fin include a same n-type dopant.

20. The semiconductor device of claim 19, wherein the second doped material layer includes a n-type doped oxide layer.

* * * * *